United States Patent
Simon

(10) Patent No.: US 10,432,384 B2
(45) Date of Patent: Oct. 1, 2019

(54) BAND SEGMENTED BOOTSTRAPS AND PARTITIONED FRAMES

(71) Applicant: Sinclair Broadcast Group, Inc., Hunt Valley, MD (US)

(72) Inventor: Michael J. Simon, Frederick, MD (US)

(73) Assignee: Sinclair Broadcast Group, Inc., Hunt Valley, MD (US)

( * ) Notice: Subject to any disclaimer, the term of this patent is extended or adjusted under 35 U.S.C. 154(b) by 0 days.

(21) Appl. No.: 15/679,739

(22) Filed: Aug. 17, 2017

(65) Prior Publication Data

US 2018/0062820 A1 Mar. 1, 2018

Related U.S. Application Data

(60) Provisional application No. 62/380,231, filed on Aug. 26, 2016.

(51) Int. Cl.
| | |
|---|---|
| *H04L 5/00* | (2006.01) |
| *H03K 19/01* | (2006.01) |
| *H04L 5/22* | (2006.01) |
| *H04L 27/26* | (2006.01) |
| *H04W 76/15* | (2018.01) |
| *G06F 17/14* | (2006.01) |

(52) U.S. Cl.
CPC .......... *H04L 5/0083* (2013.01); *H03K 19/01* (2013.01); *H04L 5/22* (2013.01); *H04L 27/2666* (2013.01); *G06F 17/142* (2013.01); *H04L 5/0007* (2013.01); *H04L 5/0044* (2013.01); *H04L 5/0048* (2013.01); *H04W 76/15* (2018.02)

(58) Field of Classification Search
CPC . H04W 72/042; H04W 72/0446; H04W 4/70; H04W 72/048
USPC ................. 370/235, 329, 336; 375/260, 295
See application file for complete search history.

(56) References Cited

U.S. PATENT DOCUMENTS

| | | |
|---|---|---|
| 2016/0043830 A1 | 2/2016 | Simon et al. |
| 2016/0056910 A1 | 2/2016 | Shelby et al. |
| 2016/0218829 A1 | 7/2016 | Fay et al. |
| 2016/0269980 A1 | 9/2016 | Simon et al. |

OTHER PUBLICATIONS

*ATSC Candidate Standard—Physical Layer Protocol* (A/322), Advanced Television Systems Committee, Doc. S32-230r45, Apr. 6, 2016, 258 pages.

(Continued)

*Primary Examiner* — Sam Bhattacharya
(74) *Attorney, Agent, or Firm* — Sterne, Kessler, Goldstein & Fox P.L.L.C.

(57) ABSTRACT

Apparatuses and methods are provided for generating, transmitting, receiving, and decoding one or more band segmented bootstrap signals and one or more corresponding partitioned post bootstrap signals. For example, a transmitter is configured to generate a first set of symbols and a second set of symbols, where the first set of symbols includes information about the second set of symbols. The transmitter is further configured to generate a third set of symbols and a fourth set of symbols, where the third set of symbols includes information about the fourth set of symbols. The transmitter is also configured to generate a data frame including the first, second, third, and fourth set of symbols. A bandwidth of the data frame includes a first segment and a second segment.

30 Claims, 24 Drawing Sheets

(56) References Cited

OTHER PUBLICATIONS

*ATSC Digital Television Standard—Part 2: RF/Transmission System Characteristics*, Advanced Television Systems Committee, Doc. A/53 Part 2:2011, Dec. 15, 2011, 28 pages.
*ATSC Standard: A/321, System Discovery and Signaling*, Advanced Television Systems Committee, Doc. A/321:2016, Mar. 23, 2016, 28 pages.
Invitation to Pay Additional Fees and, Where Applicable, Protest Fee, and Communication Relating to the Results of the Partial International Search for PCT Appl. No. PCT/US2017/048198, 14 pages, dated Dec. 6, 2017.
Notification of Transmittal of the International Search Report and the Written Opinion of the International Searching Authority, or the Declaration, for PCT Appl. No. PCT/US2017/048198, 22 pages, dated Jun. 27, 2018.
*Transmission System for Digital Terrestrial Television Broadcasting, ARIB Standard* B31, Version 1.6-E2, Association of Radio Industries and Businesses, Nov. 30, 2005, 173 pages.

BAND SEGMENTED BOOTSTRAPS AND PARTITIONED FRAMES

FIELD

The present disclosure relates to the field of wireless communication, and more particularly, to a mechanism for enabling robust signal detection and service discovery in broadcast networks.

BACKGROUND

The broadcast spectrum is divided up into different frequencies and allocated among different broadcasters for various uses in different geographic regions. The frequencies of the spectrum are allocated based on licenses granted to the broadcasters. Based on the allocations from a regulatory entity such as Federal Communications Commission (FCC) in USA, a broadcaster may be limited to broadcasting a specific type of content using a specific type of radio frequency (RF) waveform, such as a television signal, on a certain frequency within a certain geographic radius. Broadcasting outside of an allocated spectrum could be a violation for the broadcaster. If a broadcaster wishes to transmit another type of content using another type of RF waveform within that geographic radius, the broadcaster may be required to obtain an additional spectrum license and in turn be allocated an additional frequency within that frequency from regulatory entity. Similarly, if a broadcaster wishes to transmit content within another geographic radius, the broadcaster may be required to obtain an additional spectrum license for that region. Obtaining additional spectrum licenses, however, may be difficult, time consuming, expensive, and impractical. In addition, a broadcaster may not always fully utilize an entire portion of spectrum for which it has been granted a license. This may create inefficiencies in the utilization of the broadcast spectrum.

Moreover, the anticipated use of the broadcast spectrum may be changing. For example, current broadcast television solutions are monolithic and designed for a primary singular service. However, broadcasters may anticipate providing multiple wireless-based types of content using different RF waveforms, in addition to traditional broadcast television in the future, including mobile broadcasting and IoT services. In particular, there are many scenarios where a large number of devices may all wish to receive identical data from a common source beyond broadcast television. One such example is mobile communication services, where a large number of mobile communication devices in various geographic locations may all need to receive a common broadcast signal conveying the same content, such as a software update or an emergency alert, for example. In such scenarios, it is significantly more efficient to broadcast or multicast the data to such devices rather than individually signaling and sending the same data point to point to each device. Thus, a hybrid solution may be desirable.

To more efficiently utilize the broadcast spectrum, different types of content may be time-multiplexed together within a single RF channel.

In addition, content with different quality levels (e.g., high definition video, standard definition video, etc.) may need to be transmitted to different groups of devices with different propagation channel characteristics and different receiving environments. In other scenarios, it may be desirable to transmit device-specific data to a particular device, and the parameters used to encode and transmit that data may depend upon the device's location and/or propagation channel conditions.

At the same time, the demand for high-speed wireless data continues to increase, and it is desirable to make the most efficient use possible of the available wireless resources (such as a certain portion of the wireless spectrum) on a potentially time-varying basis.

SUMMARY OF THE DISCLOSURE

Systems, apparatuses, and methods are provided for generating, transmitting, receiving, and decoding one or more band segmented bootstrap signals and one or more corresponding partitioned post bootstrap signals for, for example, narrow band reception and lower complexity/power saving devices. According to some exemplary embodiments, the systems and methods of this disclosure can target narrow band reception and lower complexity/power saving devices. These devices can include Internet of Things (IoT), wearable devices, sensors networks, etc.

According one embodiment, a transmitter is provided that includes a memory configured to store program instructions and a processor. The processor, upon executing the program instructions, is configured to generate a first set of symbols and a second set of symbols. Each symbol in the first set of symbols includes a first plurality of subcarriers and each symbol in the second set of symbols includes a second plurality of subcarriers, where the first set of symbols includes information about the second set of symbols. The first plurality of subcarriers is a subset of the second plurality of subcarriers. The processor is further configured to generate a third set of symbols and a fourth set of symbols. Each symbol in the third set of symbols includes a third plurality of subcarriers and each symbol in the fourth set of symbols includes a fourth plurality of subcarriers, where the third set of symbols includes information about the fourth set of symbols. The third plurality of subcarriers is a subset of the fourth plurality of subcarriers. The processor is also configured to generate a data frame including the first, second, third, and fourth set of symbols. A bandwidth of the data frame includes a first segment including the second plurality of subcarriers and a second segment including the fourth plurality of subcarriers.

According to another embodiment, there is provided a receiver including an antenna configured to receive a data frame. The data frame includes a first set of symbols and a second set of symbols. Each symbol in the first set of symbols includes a first plurality of subcarriers and each symbol in the second set of symbols includes a second plurality of subcarriers, where the first set of symbols includes information about the second set of symbols and the first set of symbols facilitates initial synchronization at the receiver. The first plurality of subcarriers is a subset of the second plurality of subcarriers. The data frame further includes a third set of symbols and a fourth set of symbols. Each symbol in the third set of symbols includes a third plurality of subcarriers and each symbol in the fourth set of symbols includes a fourth plurality of subcarriers, where the third set of symbols includes information about the fourth set of symbols and the third set of symbols facilitates initial synchronization at the receiver. The third plurality of subcarriers is a subset of the fourth plurality of subcarriers. A bandwidth of the data frame includes a first segment including the second plurality of subcarriers and a fourth segment including the second plurality of subcarriers. The receiver further includes a filter configured to select the first segment of the bandwidth of the data frame that includes the first set of symbols.

According to another embodiment, there is provided a system including a transmitter configured to generate a data frame. The transmitter includes a memory configured to store program instructions and a processor. The processor, upon executing the program instructions, is configured to generate a first set of symbols and a second set of symbols. Each symbol in the first set of symbols includes a first plurality of subcarriers and each symbol in the second set of symbols includes a second plurality of subcarriers, where the first set of symbols includes information about the second set of symbols. The first plurality of subcarriers is a subset of the second plurality of subcarriers. The processor is further configured to generate a third set of symbols and a fourth set of symbols. Each symbol in the third set of symbols includes a third plurality of subcarriers and each symbol in the fourth set of symbols includes a fourth plurality of subcarriers, where the third set of symbols includes information about the fourth set of symbols. The third plurality of subcarriers is a subset of the fourth plurality of subcarriers. The processor is also configured to generate a data frame including the first, second, third, and fourth set of symbols. A bandwidth of the data frame includes a first segment including the second plurality of subcarriers and a second segment including the fourth plurality of subcarriers.

According to another embodiment, there is provided a transmitter that includes a memory configured to store program instructions and a processor. The processor, upon executing the program instructions, is configured to generate a data frame and cause transmission of the data frame. The data frame includes a first set of orthogonal frequency domain multiplexing (OFDM) symbols and a second set of OFDM symbols, each OFDM symbol in the first set of OFDM symbols and the second set of OFDM symbols includes a plurality of subcarriers. Each OFDM symbol in the data frame is partitioned into a plurality of segments and each segment of the plurality of segments includes a subset of the plurality of subcarriers. A first segment in the first set of OFDM symbols includes information about a corresponding first segment in the second set of OFDM symbols that facilitates initial synchronization at a receiver. The first segment of the second set of OFDM symbols is configured to be decoded, based at least in part on the information contained in the first segment of the first set of OFDM symbols, independently of other segments of the second set of OFDM symbols.

Further features and advantages of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate present disclosure and, together with the description, further serve to explain the principles of the disclosure and to enable a person skilled in the relevant art(s) to make and use the disclosure.

Figure 1:
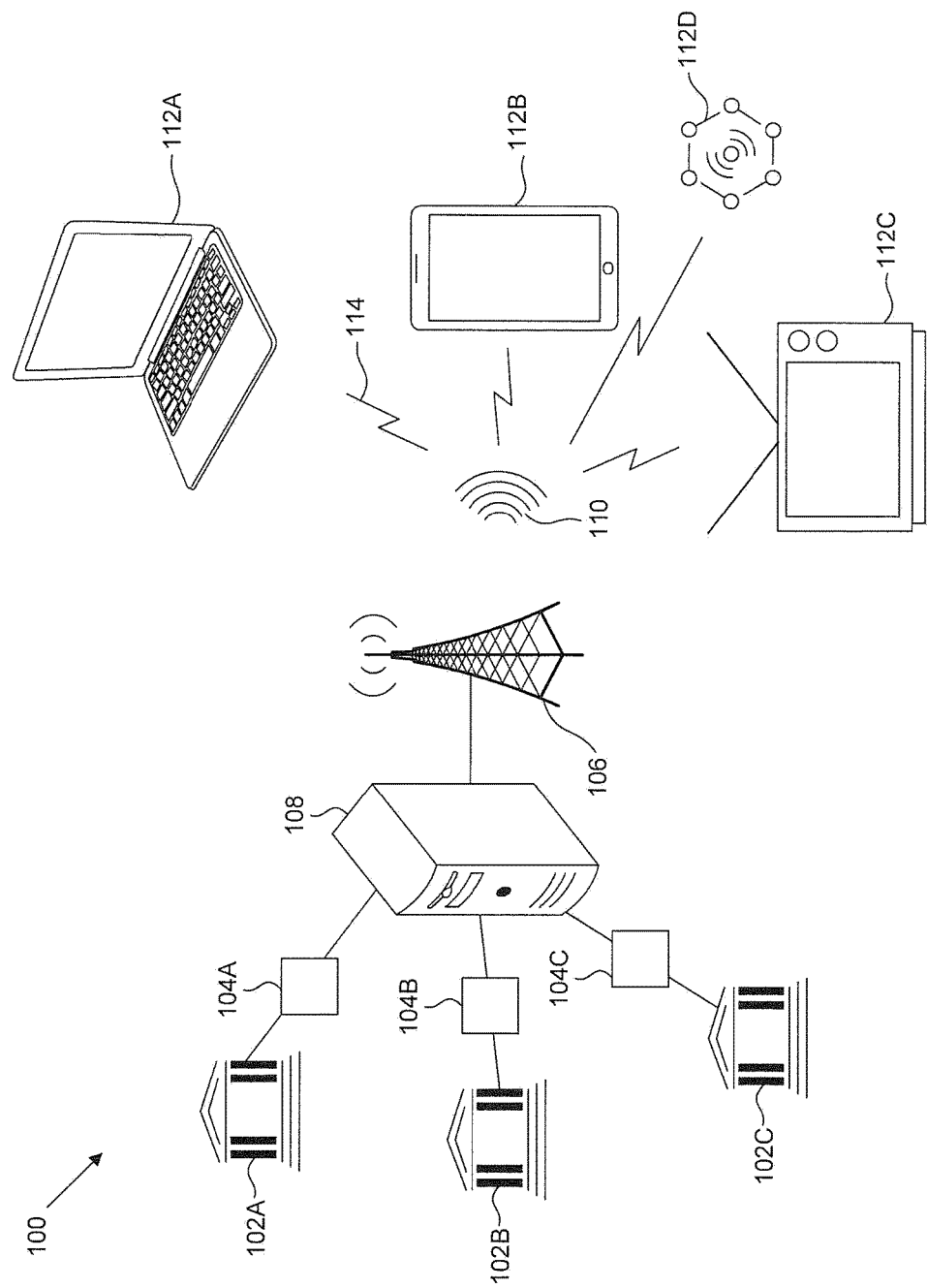
FIG. 1 illustrates an exemplary broadcast network communications system, according to an embodiment of the present disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following detailed description of the present disclosure refers to the accompanying drawings that illustrate exemplary embodiments consistent with this disclosure. Other embodiments are possible, and modifications can be made to the embodiments within the spirit and scope of the present disclosure. Therefore, the detailed description is not meant to limit the present disclosure. Further, the scope of the present invention is defined by the appended claims.

It would be apparent to one of skill in the art that aspects of the present disclosure, as described below, can be implemented in many different embodiments of software, hardware, firmware, and/or the entities illustrated in the figures.

Any actual software code with the specialized control of hardware to implement the present disclosure is not limiting of the present disclosure. Thus, the operational behavior of the present disclosure will be described with the understanding that modifications and variations of the embodiments are possible, given the level of detail presented herein.

This specification discloses one or more embodiments that incorporate the features of this disclosure. The disclosed embodiment(s) merely exemplify the disclosure. The scope of the disclosure is not limited to the disclosed embodiment(s). Further, the invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Reference to modules in this specification and the claims means any combination of hardware or software components for performing the indicated function. A module need not be a rigidly defined entity, such that several modules can overlap hardware and software components in functionality. For example, a software module can refer to a single line of code within a procedure, the procedure itself being a separate software module. One skilled in the relevant arts will understand that the functionality of modules can be defined in accordance with a number of stylistic or performance-optimizing techniques, for example.

Systems and methods for robust and extensible signaling, robust detection and service discovery, system synchronization, and receiver configuration are discussed in U.S. Patent Application Publication No. 2016-0269980, which is incorporated by reference herein in its entirety. For example, bootstrap signals are disclosed in U.S. Patent Application Publication No. 2016-0269980 for synchronization and for the signaling to discover a waveform being emitted via low level signaling to start decoding a waveform that follows. The bootstrap signal provides extensibility to evolve over time. For example, the bootstrap signal can work for current broadcasting system but also allows for support of new services. U.S. Patent Application Publication Nos. 2016/0043830 (Dynamic Configuration of a Flexible Orthogonal Frequency Division Multiplexing PHY Transport Data Frame) and 2016/0056910 (Dynamic Configuration of a Flexible Orthogonal Frequency Division Multiplexing PHY Transport Data Frame Preamble) are also incorporated by reference herein in their entirety.

Some of the embodiments described herein are improvements to and applications of the bootstrap signals and the frames that can follow the bootstrap signal. According to some exemplary embodiments, the systems and methods of this disclosure can target narrow band reception and lower complexity/power saving for receiving devices. This is enabled by constructing a broader bandwidth transmitted signal using techniques that enable a narrow band reception device to tune to synchronize, discover and receive content from one of a plurality of smaller bandwidth post bootstrap partitions of the broader bandwidth transmitted signal constructed for such purpose. These devices can include Internet of Things (IoT), wearable devices, sensors networks, etc. In some examples, the systems and methods of this disclosure can be compatible with Advanced Television Systems Committee (ATSC) 3.0 Standard A/321, System Discovery and Signaling (Approved 23 Mar. 2016), which is incorporated by reference herein in its entirety. The systems and methods of this disclosure can scale one or more design parameters of the A/321 Standard while maintaining one or more technical attributes of the A/321 Standard.

A new flexible and extensible RF waveform has been developed by the ATSC in the form of a new standard called ATSC 3.0. The potential multiple waveform types in ATSC 3.0 begin with a small universal A/321 signal termed the bootstrap signal. The bootstrap signal enables initial synchronization, and discovery of what type of waveform and required low level signaling to receive the RF waveform and content that immediately follows the bootstrap signal is termed the post bootstrap signal. This bootstrap signal was adopted in ATSC 3.0 as A/321 and specified by U.S. Patent Application Publication No. 2016-0269980, and is now being scaled or adapted in this application to support synchronization, discovery and signaling of narrow bandwidth reception and enabling energy savings by battery powered receivers. ATSC 3.0 supports only bandwidths of 6, 7, 8 MHz. As one example a 6 MHz bandwidth channel can be segmented and partitioned into five independent narrow bandwidth channels within 6 MHz. Each with a specific RF waveform and service targeting battery powered devices. Broadcasters can still serve traditional full bandwidth television services and narrow bandwidth services by time multiplexing different RF waveforms each preceded by a bootstrap signal.

As discussed below in more detail, by scaling one or more parameters, the systems and methods of this disclosure are configured to enable partition bandwidth reception in a channel, according to some embodiments. According to some embodiments, receiver synchronization and signaling can support the partitioned reception. Additionally, the systems and methods of this disclosure can result in lower complexity reception, lower sampling rate, smaller Fast Fourier Transform (FFT) size, and bandwidth segmentation. Also, as discussed in more detail below, the systems and methods of this disclosure can support one or more independent band segmented bootstrap signals and one or more corresponding independent partitioned post bootstrap signals. According to some embodiments, by partitioning the bandwidth, separate low bandwidth channels (partitions) can share a common inverse-FFT (IFFT) stage. In some embodiments, one or more frames with partitioned bandwidths can be time division multiplexed with frames that are not partitioned, so as to target different devices.

FIG. 1 illustrates an exemplary broadcast network communications system, according to an embodiment of the present disclosure. The broadcast network communications system 100 can include a plurality of content providers 102A, 102B, and 102C (hereinafter content provider 102) providing a variety of types of content 104A, 104B, and 104C (hereinafter content 104) via a broadcast network 106. Although three content providers 102 are illustrated, broadcast network communications system 100 can include any suitable number of content providers 102. In addition, content providers 102 can be providers of any suitable types of content, such as televisions broadcast signals, software updates, emergency alerts, and so on. Content providers 102 can be configured to provide content 104 via either a wireless or wired connection to a gateway 108.

According to some embodiments, content 104 can be time-multiplexed, at gateway 108, into a single RF channel 110. The broadcast receivers 112A, 112B, 112C, and 112D (hereinafter broadcast receiver 112) are configured to identify and receive the broadcast signals 114 via the RF channel 110. Although four different types of broadcast receivers 112 are illustrated (a laptop computer 112A, a mobile telephone 112B, a television 112C, and an IoT 112D), system 100 can include any suitable number and type of broadcast receivers 112, such as, but not limited to, wearable devices, sensor networks, etc.

According to some embodiments, gateway 108, alone or in combination with a transmitter in broadcast network 106, can be configured to generate and transmit one or more bootstrap signals and one or more corresponding post bootstrap signals. Additionally or alternatively, gateway 108, alone or in combination with a transmitter in broadcast network 106, can be configured to generate and transmit one or more band segmented bootstrap signals and one or more corresponding partitioned post bootstrap signals. According to some embodiments, a bootstrap signal (not shown) and/or a band segmented bootstrap signal (not shown) can indicate, at a low level, the type or form of a signal 114 that is being transmitted during a particular time period. Using the bootstrap signal and/or the band segmented bootstrap signal, broadcast receiver 112 can discover and identify signal 114, which can indicate how to receive the services that are available via signal 114.

In this example, the bootstrap signal, the band segmented bootstrap signal, or a combination thereof can be relied on as a part of a transmit frame to allow for synchronization, detection, decoding, and/or system configuration. As will be described, the bootstrap signal or the band segmented bootstrap signal can include a flexible signaling approach to convey frame configuration and content control information to broadcast receiver 112. The bootstrap signal or the band segmented bootstrap signal describe the mechanism by which signal parameters are modulated on the physical medium. The bootstrap signal or the band segmented bootstrap signal describe the specific encoding used to communicate parameter selections governing the transmit frame configuration. This enables reliable service discovery while providing extensibility to accommodate evolving signaling needs from a common frame structure. Specifically, the design of the bootstrap enables universal signal discovery independent of channel bandwidth.

The bootstrap signal or the band segmented bootstrap signal also enables reliable detection in the presence of a variety of channel impairments such as time dispersion and multipath fading, Doppler shift, and carrier frequency offset. In addition, multiple service contexts are accessible based on mode detection during signal discovery enabling broad flexibility in system configuration. The bootstrap signal or the band segmented bootstrap signal also facilitates extensibility to accommodate ongoing evolution in service capability. Thus, new signal types not yet conceived, could be provided by content provider 102 and identified within a transmitted signal 114 through the use of the bootstrap signal, the band segmented bootstrap signal, or the combination thereof. Moreover, reusable bit-fields interpreted based on the detected service mode/type enable bit-efficient signaling despite the level of extensibility afforded. In one embodiment, the bootstrap signal and the band segmented bootstrap signal are configured to be a robust signal and detectable even at low signal levels. As a result, individual signaling bits within the bootstrap signal and/or the band segmented bootstrap signal can be comparatively expensive in terms of physical resources that they occupy for transmission. Thus, the bootstrap signal, the band segmented bootstrap signal, or the combination thereof can be intended to signal only the minimum amount of information required for system discovery and for initial decoding of the following signal.

Figure 2A:
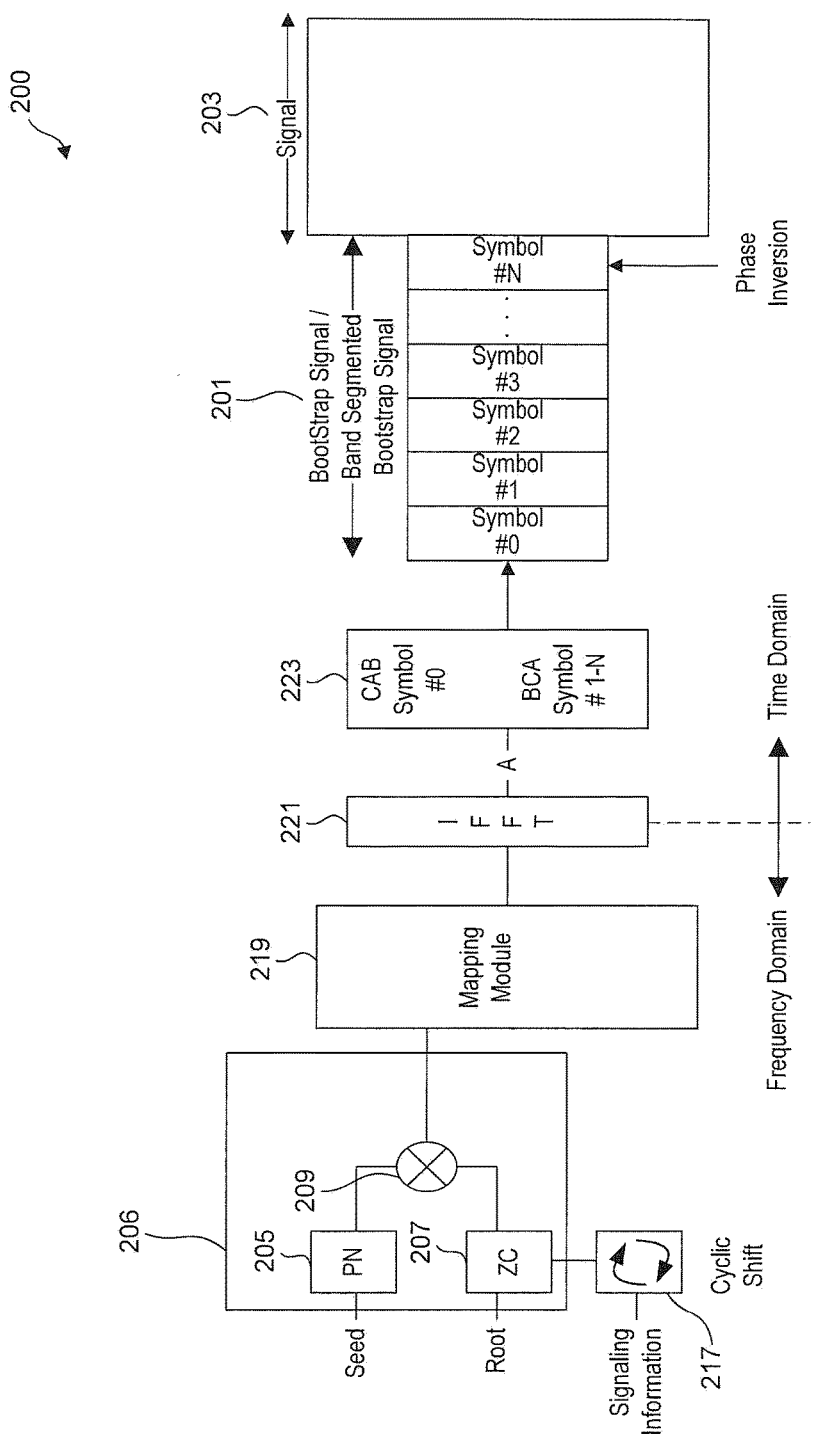
FIG. 2A illustrates a system for generating a bootstrap signal or a band segmented bootstrap signal, according to some embodiments of the present disclosure.

FIG. 2A illustrates a system for generating a bootstrap signal, a band segmented bootstrap signal, or the combination thereof, according to some embodiments of the present disclosure. Herein, the bootstrap signal and/or the band segmented bootstrap signal means a bootstrap signal, a band segmented bootstrap signal, or the combination thereof, unless otherwise specified. System 200 can be configured in a transmitter for generating and transmitting bootstrap signals and/or band segmented bootstrap signals. For example, system 200 can be configured to generate bootstrap signal or band segmented bootstrap signal 201. According to some embodiments, bootstrap signal or band segmented bootstrap signal 201 can include a plurality of symbols – symbol #0 through symbol #N. The plurality of symbols of bootstrap signal or band segmented bootstrap signal 201 can include Orthogonal frequency-division multiplexing (OFDM) symbols, according to some embodiments. Bootstrap signal or band segmented bootstrap signal 201 can be followed by post bootstrap signal or partitioned post bootstrap signal 203. Post bootstrap signal or partitioned post bootstrap signal 203 can represent services and/or data being signaled by bootstrap signal or band segmented bootstrap signal 201 and used by a receiver, such as receiver 112. According to some embodiments, post bootstrap signal or partitioned post bootstrap signal 203 can include OFDM symbols.

According to some embodiments, system 200 can include a sequence generator 206. Sequence generator 206 can include a pseudo noise (PN) module or sequence generator 205 and a Zadoff-Chu (ZC) module or sequence generator 207. PN sequence generator 205 can be configured to receive a seed value and generate an output sequence. ZC sequence generator 207 can be configured to receive a root value and generate an output sequence. The seed value of PN sequence generator 205 and the root value of ZC sequence generator 207 can signal the major and minor versions (respectively) of bootstrap signal or band segmented bootstrap signal 201. According to some embodiments, the output sequence of ZC sequence generator 207 can include a complex-valued mathematical sequence that, when applied to radio signals, can result in a constant amplitude signal.

The output sequence of ZC sequence generator 207 can be calculated based on the following equation:

$$Z_q(k) = e^{-j\pi q \frac{k(k+1)}{N_{ZC}}} \qquad \text{Equ. (1)}$$

In this equation, $Z_q(k)$ is the output sequence of ZC sequence generator 207. The value q is the root value of the ZC sequence generator 207, where $q \in \{1, 2, \ldots, N_{ZC}-1\}$. $N_{ZC}$ is the length of the output sequence of ZC sequence generator 207. And $k=0, 1, 2, \ldots, N_{ZC}-1$.

According to some embodiments, system 200 can also include a cyclic shift module 217 configured to receive signaling information and apply cyclic shifts based on the signaling information. According to some embodiments, cyclic shift module 217 can be configured to apply the cyclic shift in a frequency domain to ZC sequence generator 207, which will be used to generate the output sequence of ZC sequence generator 207. According to some embodiments, the cyclic shift is applied to symbols #1 through #N of bootstrap signal or band segmented bootstrap signal 201. In this example, the cyclic shift is not applied to the first symbol (symbol #0) of bootstrap signal or band segmented bootstrap signal 201. In the frequency domain, cyclic shift module 217 applies the cyclic shift as a phase shift to the ZC sequence generator 207. For example, when cyclic shift is applied to symbols #1 through #N of bootstrap signal or band segmented bootstrap signal 201, equation (1) above will be changed to the following:

$$Z_q(k) = e^{-j\pi q \frac{(k-m)(k-m+1)}{N_{ZC}}} \qquad \text{Equ. (2)}$$

Here in equation (2) the value of m represents the assigned cyclic phase shift in the frequency domain. This shift in the frequency domain can be translated to time delay of auto-correlation after IFFT module 221.

Additionally or alternatively, cyclic shift module 217 can be configured to apply the cyclic shift in a time domain to the output of IFFT module 221, as discussed in more detail below.

The output sequences of PN sequence generator 205 and ZC sequence generator 207 are modulated using modulator 209. According to some embodiments, modulator 209 can include a multiplier configured to multiply the output sequences of PN sequence generator 205 and ZC sequence generator 207. Additionally or alternatively, modulator 209 can include a multiplier configured to multiply sequences derived from the output sequences of PN sequence generator 205 and ZC sequence generator 207.

The output sequence of PN sequence generator 205 introduces a phase rotation to individual complex subcarriers retaining the desirable Constant Amplitude Zero Auto-Correlation (CAZAC) properties of the output sequence of ZC sequence generator 207. The output sequence of PN sequence generator 205 further suppresses spurious emissions in the autocorrelation response, thereby providing additional signal separation between cyclic shifts of the same root sequence. The output of modulator 209 is input to mapping module 219. Mapping module 219 can be configured to map the modulated sequence, which is the modulation of the output sequence of PN sequence generator 205 and the output sequence of ZC sequence generator 207, to a plurality of subcarriers. Additionally, mapping module 219 can be configured to add zero paddings for the segments of the band segmented bootstrap signal, according to some embodiments. When zero paddings are added, values of zero are mapped to outer subcarriers in each segment of the band segmented bootstrap signal. The number of subcarriers used for zero padding can depend on the bandwidth of each segment of the band segmented bootstrap signal, the total number of segments, and the total bandwidth of the band segmented bootstrap signal. The operation of mapping module 219 is further discussed below.

The output of mapping module 219 is input to IFFT module 221 and is converted from frequency domain to time domain. The output of IFFT module 221 is input to sequencer module 223. According to some embodiments, the output of IFFT module 221 is termed "A," which then can have pre-fix and post-fix sections derived from "A" known as "B" and "C". In some embodiments, symbol #0 can have a time sequence "CAB" while all other symbols can have a time sequence of "BCA". The operation of sequencer module 223 is discussed in more detail below. Operation of sequencer module 223 can add robustness and discriminate symbol #0, which can be used for synchronization and versioning. The output of sequencer module 223 includes bootstrap signal or band segmented bootstrap signal 201.

Bootstrap signal or band segmented bootstrap signal 201 begins with a synchronization symbol #0 positioned at the start of each waveform to enable service discovery, coarse synchronization, frequency offset estimation, and initial channel estimation, according to some embodiments. The remainder bootstrap signal or band segmented bootstrap signal 201 can contain sufficient control signaling to permit the reception and decoding of the remainder of the signal waveform 114 (e.g., post bootstrap signal or post band segmented bootstrap signal 203).

Bootstrap signal or band segmented bootstrap signal 201 is configured to exhibit flexibility, scalability, and extensibility. For example, bootstrap signal or band segmented bootstrap signal 201 can implement versioning for increased flexibility. Specifically, bootstrap signal or band segmented bootstrap signal 201 design can enable a major version number (corresponding to a particular service type or mode) and a minor version (within a particular major version). In one embodiment, the versioning can be signaled via appropriate selection of a Zadoff-Chu root (major version) and a Pseudo-Noise sequence seed (minor version) used for generating the base encoding sequence for bootstrap signal or band segmented bootstrap signal 201. The decoding of signaling fields within bootstrap signal or band segmented bootstrap signal 201 can be performed with regard to the detected service version, enabling hierarchical signaling where each assigned bit-field is reusable and is configured based on the indicated service version. The syntax and semantics of signaling fields within the bootstrap signal or band segmented bootstrap signal 201 can be specified, for example, within standards to which the major and minor version refers.

Figure 2B:
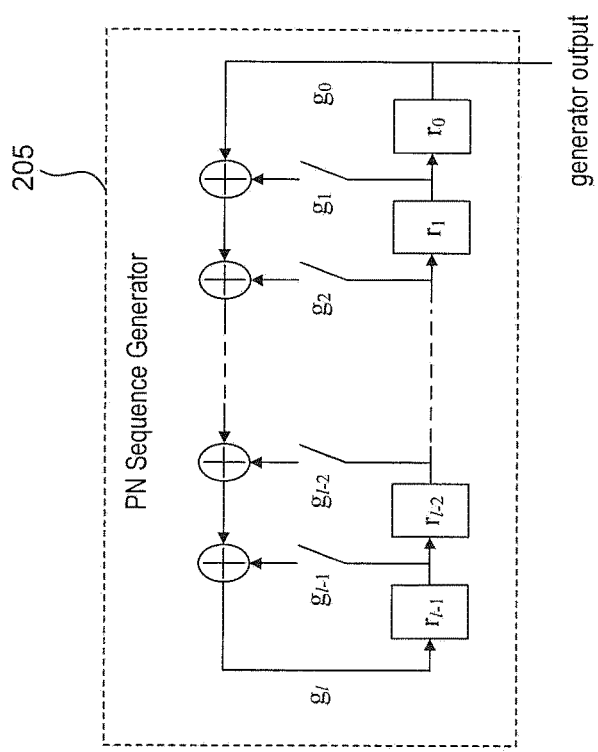
FIG. 2B illustrates an exemplary PN sequence generator, according to some embodiments of the present disclosure.

FIG. 2B illustrates an exemplary PN sequence generator 205, according to some embodiments of the present disclosure. For example, PN sequence generator 205 can include a Linear Feedback Shift Register (LFSR). According to some embodiments, the LFSR can have a length (order) of l=16. However, the LFSR can include other lengths. The operation of the LFSR can be governed by a generator polynomial $g_l, g_{l-1}, g_{l-2}, \ldots, g_2, g_1, g_0$ specifying the taps in the LFSR feedback path. The LFSR also receives initial state of the registers represented as seed $r_{l-1}, r_{l-2}, \ldots, r_2, r_1, r_0$, which corresponds to a minor version number of the bootstrap signal or the band segmented bootstrap signal.

The registers of PN sequence generator 205 can be reinitialized with the initial state from the seed before generating a first symbol of the bootstrap signal or the band segmented bootstrap signal. PN sequence generator 205 can continue to sequence from one symbol to another symbol within the bootstrap signal or the band segmented bootstrap signal without re-initialization within the same bootstrap signal or the same band segmented bootstrap signal.

The output of the PN sequence generator 205 can be defined as p(k), which will have a value of either 0 or 1. The value of p(0) can be equal to the PN sequence generator output after the PN sequence generator 205 has been initialized with the seed value and before any clocking of the shift register. A new output p(k) can subsequently be generated when the shift register is clocked on position to the right. According to some embodiments, the generator polynomial can include the following:

$$\{g_l, g_{l-1}, g_{l-2}, \ldots, g_2, g_1, g_0\} = \{1,1,1,0,0,0,0,0,0,0,0,0,0,0,1,1\} \quad \text{Equ. (3)}$$

The polynomial based on the:

$$p(x) = x^{16} + x^{15} + x^{14} + x + 1 \quad \text{Equ. (4)}$$

In this example, the value of $g_0$ in equation (3) is the coefficient multiplying $x^0$ in equation (4). The value of $g_1$ in equation (3) is the coefficient multiplying $x^1$ in equation (4). The value of $g_2$ in equation (3) is the coefficient multiplying $x^2$ in equation (4). The value of $g_3$ in equation (3) is the coefficient multiplying $x^3$ in equation (4). So forth until the value of $g_{16}$ in equation (3) is the coefficient multiplying $x^{16}$ in equation (4).

Figure 2C:
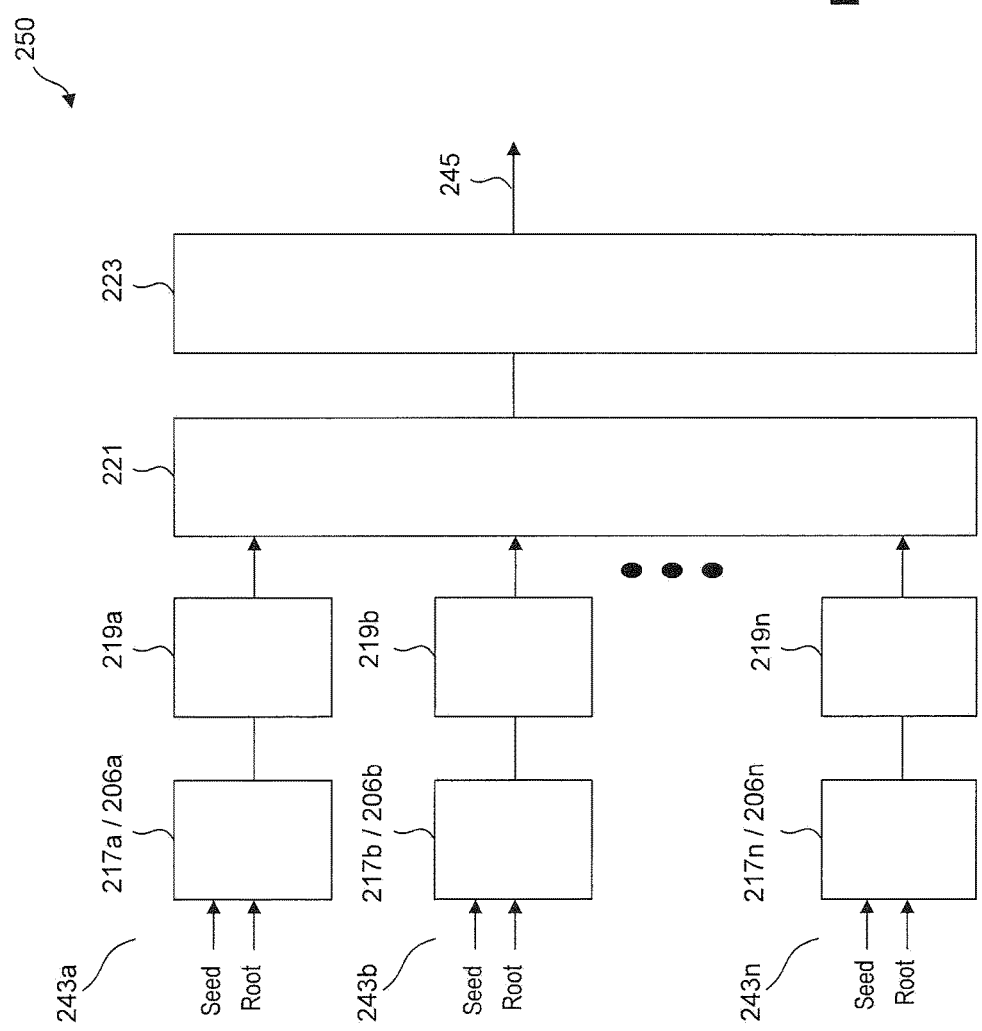
FIG. 2C illustrates a system for generating a data frame, which can include a plurality of bootstrap signals and/or a plurality of band segmented bootstrap signals, according to some embodiments of the present disclosure.

FIG. 2C illustrates a system for generating a plurality of bootstrap signals and/or a plurality of band segmented bootstrap signals, according to some embodiments of the present disclosure. System 250 can be configured in a transmitter for generating and transmitting a plurality of bootstrap signals and/or a plurality of band segmented bootstrap signals, as illustrated, for example, in FIGS. 4A-4C. For example, system 250 can be a transmitter or part of a transmitter in gateway 108 and/or broadcast network 106.

According to one embodiment, system 250 can include one or more sequence generators 206a-206n, one or more cyclic shift modules 217a-217n, one or more mapping modules 219a-219n, an IFFT module 221, and a sequencer modules 223. Sequence generators 206a-206n, cyclic shift modules 217a-217n, mapping modules 219a-219n, IFFT module 221, and sequencer module 223 were discussed above.

Each branch 243a-243n of system 250 operates in a similar manner as system 200 of FIG. 2A. For example, sequence generator 206a can include a PN sequence generator and a ZC sequence generator, and can be configured to receive a seed value and a root index value, as discussed above, for example, with respect to FIG. 2A. Sequence generator 206a can be configured to generate a complex sequence by modulating a constant amplitude zero autocorrelation sequence generated based on the root index value with a Pseudo-Noise sequence generated based on a seed value. According to some embodiments, cyclic shift module 217a can receive signaling information, generate cyclic shift(s), and apply the cyclic shift to the ZC sequence before the ZC sequence and the PN sequence are modulated.

Mapping module 219a can be configured to map the complex sequence to one or more subcarriers. IFFT module 221 can translate the output of mapping modules 219a-219n to a time domain sequence. Mapping module 219a can also be configured to add zero paddings, as discussed above. According to some embodiments, the cyclic shift module 217a can be applied after IFFT module 221 and to the time domain sequence to generate a shifted time domain sequence. In other words, cyclic shift module 217a can be applied before mapping module 219a and/or after IFFT module 221. Sequencer module 223 is configured to generate sequence CAB and/or BCA as discussed in more details below. Therefore, system 250 generates a band segmented bootstrap signal 245 as illustrated, for example, in FIGS. 4A-4C. In other words, the output 245 of system 250 can be a band segmented bootstrap signal that is generated as a combination of signals generated by branches 243a-243n.

According to some embodiments, system 250 can include one IFFT module 221 that is shared by one or more branches 243a-243n. In this embodiment, the outputs of one or more mapping modules 219a-219n are input to the one IFFT module 221 to combine and translate the outputs of mapping modules 219a-219n to a time domain sequence. According to some embodiments, one or more branches 243a-243n can include five branches generating a band segmented bootstrap signal with five segments. When a common IFFT module is used for the five branches, the common IFFT module 221 can have an FFT length of 2048. According to some embodiments, one or more branches 243a-243n can include two branches generating a band segmented bootstrap signal with two segments. When a common IFFT module is used for the two branches, the common IFFT module 221 can have a FFT length of 2048. Other numbers of branches can be employed in further embodiments.

When system 250 includes one IFFT module 221 that is shared by one or more branches 243a-243n, system 250 can also include one sequencer module 223 configured to generate sequences CAB and/or BCA as discussed in more details below. In this embodiment, the common sequencer module 223 can detect the segments in the band segmented bootstrap signal and generate CAB and/or BCA sequences for each segment of the band segmented bootstrap signal.

According to some examples, mapping modules 219a-219n are configured to map their input complex sequences to one or more set of subcarriers. For example, mapping modules 219a-219n are configured to map their input complex sequences to first, second, . . . , $n^{th}$ set of subcarriers, which are different sets of subcarriers. For example, each of mapping modules 219a-219n can map its input to a different set of subcarriers than other mapping modules 219a-219n. In other words, each of the first, second, . . . , $n^{th}$ set of subcarriers of outputs of mapping modules 219a-219n is shifted with respect to other set of subcarriers such that the segments of the band segmented bootstrap signal 245 are placed next to each other in the frequency domain, as shown, for example, in FIGS. 4A-4C.

According to some examples, each of mapping modules 219a-219n can map its input to a different set of subcarriers than other mapping modules 219a-219n using its respective cyclic shift module 217a-217n. As discussed above, each cyclic shift module 217 can apply cyclic in the frequency domain to ZC sequence generator, which will be used to generate the output sequence of ZC sequence generator. For example, as long as the output sequence of ZC sequence generator (within one or more sequence generators 206a-206n) is provided in the desired frequency range, each of mapping modules 219a-219n can map its input to a different set of subcarriers than other mapping modules 219a-219n. However, the embodiments of this disclosure are not limited to these examples and other methods can be used for each of mapping modules 219a-219n to map its input to a different set of subcarriers than other mapping modules 219a-219n within the common IFFT module 221.

According to some examples, branches 243a-243n of system can be configured to simultaneously or substantially simultaneously operate to generate the band segment bootstrap signal 245. In some embodiments, system 250 can include a multiplexing switch (not shown) between common IFFT module 221 and mapping modules 219a-219n for connecting each branch of system 250 to IFFT module 221.

According to some exemplary embodiments, the system 250 can target narrow band reception and lower complexity/power saving for receiving devices. This is enabled by constructing a broader bandwidth transmitted signal that is segmented into signals with smaller bandwidth that can enable a narrow band reception device to tune to synchronize, discover and receive content from one of the plurality of smaller bandwidth signals.

Although each branch 243a-243n of system 250 is shown as including similar modules/devices, one or more branches 243a-243n can share one or more of the modules/devices. For example, system 250 can include one cyclic shift module 217 that can apply cyclic shift to, for example, the output of one or more IFFT module 221 and/or to one or more ZC sequence generator of one or more sequence generators 206a-206n. Additionally or alternatively, system 250 can include a plurality of IFFT modules 221. For example, each of the branches 243a-243n can include one IFFT module 221 for that branch. Additionally or alternatively, system 250 can include more than one sequencer module 223. For example, each of the branches 243a-243n can include one sequencer module 223 for that branch. In some examples, a multiplexer (as one example) can be used to combine the band segmented bootstrap signals.

Figure 2D:
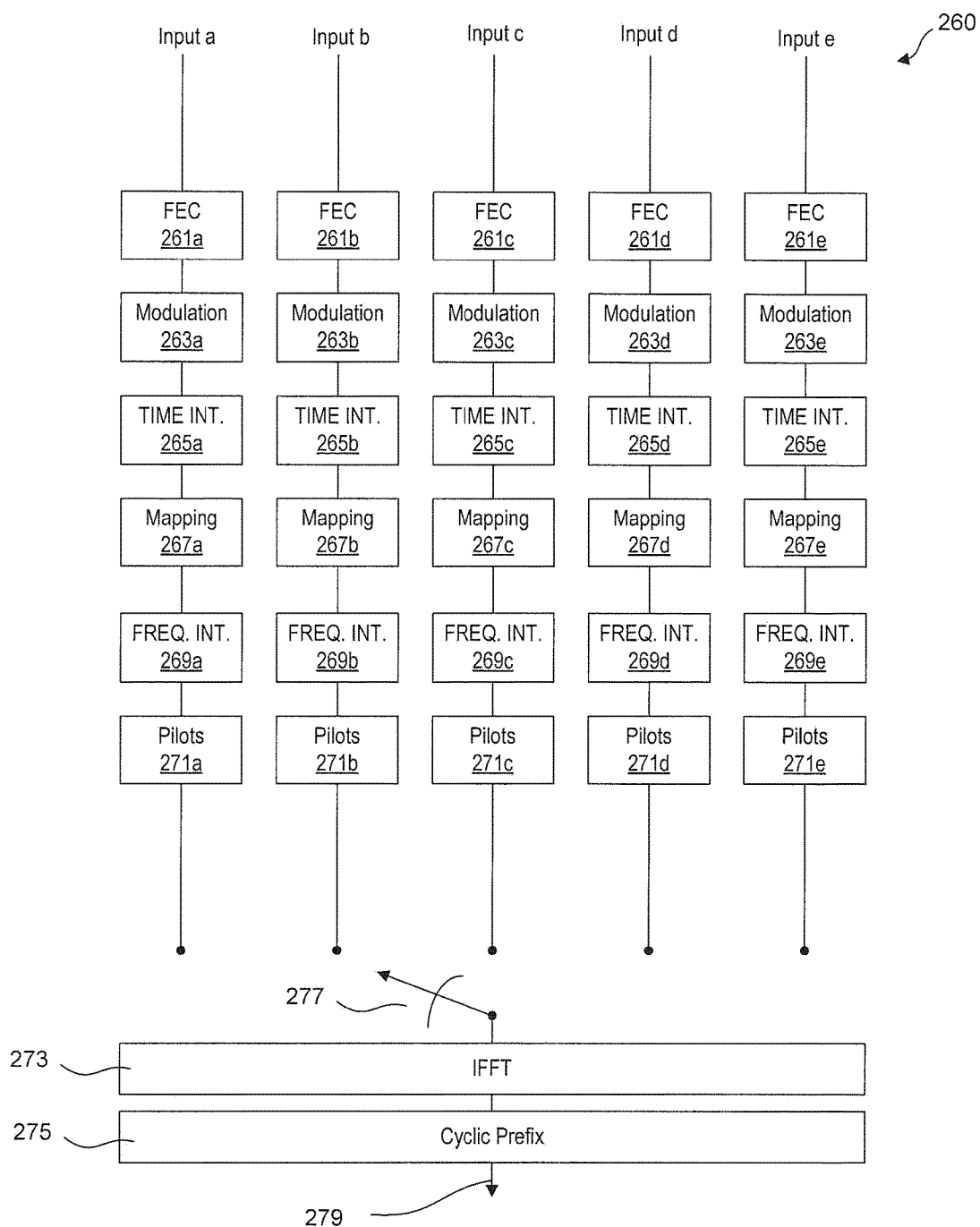
FIG. 2D illustrates a system for generating post bootstrap signals and/or partitioned post bootstrap signals, according to some embodiments of the present disclosure.

FIG. 2D illustrates a system for generating post bootstrap signals and/or partitioned post bootstrap signals, according to some embodiments of this disclosure. System 260 of FIG. 2D can be configured in a transmitter for generating and transmitting a plurality of post bootstrap signals and/or partitioned post bootstrap signals as illustrated, for example, in FIGS. 4A-C. For example, system 260 can be a transmitter or part of a transmitter in gateway 108 and/or broadcast network 106.

According to some embodiments, each branch of system 260 of FIG. 2D can correspond to one branch of system 250 of FIG. 2C. In other words, each branch of system 260 that generates a partitioned post bootstrap signal (or post bootstrap signal) can have a corresponding branch of system 250 of FIG. 2C that generates the corresponding band segmented bootstrap signal (or bootstrap signal). The band segmented bootstrap signal (or the bootstrap signal) comprises information about its corresponding partitioned post bootstrap signal (or post bootstrap signal) to facilitate initial synchronization at a receiver, according to some embodiments. Additionally or alternatively, the band segmented bootstrap signal (or the bootstrap signal) comprises information about its corresponding partitioned post bootstrap signal (or post bootstrap signal) to facilitate the receiver to receive and decode the data in the corresponding partitioned post bootstrap signal (or post bootstrap signal).

According to some embodiments, system 260 can be used to generate an Orthogonal Frequency Division Multiplexed (OFDM) signal to be transmitted at the physical layer. Data in the form of information bits Input a-Input e are inputted to each branch of system 260. Each one of Input a-Input e can carry data associated with a particular service. For example, the inputs can carry data associated with a television program, the video stream for a program, the audio stream for a program, closed-caption information, data for IoT devices, update data for suitable types of services, and any other data associated with other suitable types of services.

The data belonging to each one of Input a-Input e is sent through Forward Error Correction ("FEC") coding modules 261a-261e, and coding such as Low Density Parity Check ("LDPC") coding or turbo coding are applied to the inputs. It is noted that other coding scheme can also be applied to the inputs. The coded bits are input to the modulators 263a-263e, which are used to modulate constellation symbol using a modulation approach such as binary phase shift keying (BPSK), Quadrature Phase Shift Keying ("QPSK"), N-QAM or other modulation schemes, for example. Time interleaving can optionally be applied to the modulation symbols using time interleaving modules 265a-265e.

The resulting modulation symbols from one or multiple time interleaving modules 265a-265e are then mapped using mapping modules 267a-267e to specific resources or data cells within a block of resources. Such a block of resources can be termed as a frame, as a partition within a frame, or as a sub-frame within a frame. Specifically, a partition can be thought of as a subset of resources within a frame, with a frame containing one or more partitions. The block of resources can be represented as a logical grid of data cells with dimensions in both time and frequency domains. For example, each data cell can carry one modulation symbol while each column of data cells belongs to one OFDM symbol.

The data cells belonging to each OFDM symbol can undergo optional frequency interleaving using frequency interleavers 269a-269e on a per OFDM symbol basis in order to improve frequency diversity. Scattered pilot, edge pilot, and/or continual pilot values are inserted using pilots modules 271a-271e at appropriate locations within each OFDM symbol to assist with channel estimation and carrier tracking at a receiver. It is note that although some modules of system 260 are illustrated in FIG. 2D, some of these modules can be optional. Additionally or alternatively, system 260 can include additional modules for generating partitioned post bootstrap signals and/or post bootstrap signals.

The resulting multiplexed data and pilot cells then can undergo an Inverse Fast Fourier Transform ("IFFT") using IFFT module 273. According to one embodiment, system 260 can include a common IFFT module 273 used for transforming data from each branch of system 260 from frequency domain to the time domain. In this embodiment, a switch 277 can be used for connecting each branch of system 260 to IFFT module 273. In this embodiment, the channels can simultaneously or substantially simultaneously be processed through the single IFFT module 273, creating a single OFDM symbol, by allocating them on orthogonal sub-bands of the overall bandwidth. The receiver can focus on a single channel and can use a smaller FFT size module.

According to one non-limiting example, output signal 279 (partitioned post bootstrap signal 279) can have a sampling rate ($F_S$) of 6.912 MHz ($F_S$=N*0.384 MHz, where N=18). In this example, the useful bandwidth for transmitted signal 279 assuming a 6 MHz channel can be around 5.7 MHz with guard bands on each edge. In this case, IFFT module 273 can use FFT size ($N_{FFT}$) of 8K, 16K, or 32K (although other values of FFT size can also be used.) In other words, a $N_{FFT}$=8K point, a $N_{FFT}$=16K point, or a $N_{FFT}$=32K point IFFT module 273 is used. Assuming an IFFT size of 8K for IFFT module 273, in this example, each symbol in output of IFFT module 273 can have a length of about 1.17 ms without cyclic prefix. The length of each symbol in signal 279 can be about 1.17 ms plus the added cyclic prefix 275 used to mitigate multipath on the receiver in OFDM. Also, the frequency spacing between sub-carriers ΔF in this example can be around 854 Hz. In this non-limiting example, and assuming the partitioned post bootstrap signal 279 has five segments, each receiver that receives one segment can have a useful bandwidth 5.7 MHz/5 of around 1.140 MHz, an FFT module (e.g., FFT module 1107 of FIG. 11) with FFT size of 2K (8K/4), and using a reduced sampling rate $F_S$=1.728 MHz (6.912 MHz/4) while maintaining frequency spacing between sub-carriers of around 854 Hz. By holding the sub-carrier ΔF constant by reducing both the sampling rate $F_S$ and FFT size by 4 for the receiver (see, for example, Equ. (6)) the receiver can benefit from power savings (lower $F_S$, FFT) important to battery powered devices while receiving a useful segmented bandwidth of 1.140 MHz. The Common 8K IFFT 273 in this example increases spectrum efficiency by maintaining orthogonality and eliminating the need for guard bands in frequency between segments of partitioned post bootstrap signals which carry the services.

Alternatively, system 260 can include a plurality of IFFT modules. For example, system 260 can include one IFFT module for each of the branches of system 260. In this embodiment, a multiplexer (as one example) can be used to combine the partitioned post bootstrap signals (and/or post bootstrap signals).

Finally, a cyclic prefix is prepended using cyclic prefix module 275 to the time-domain samples for each OFDM symbol.

Figure 3:
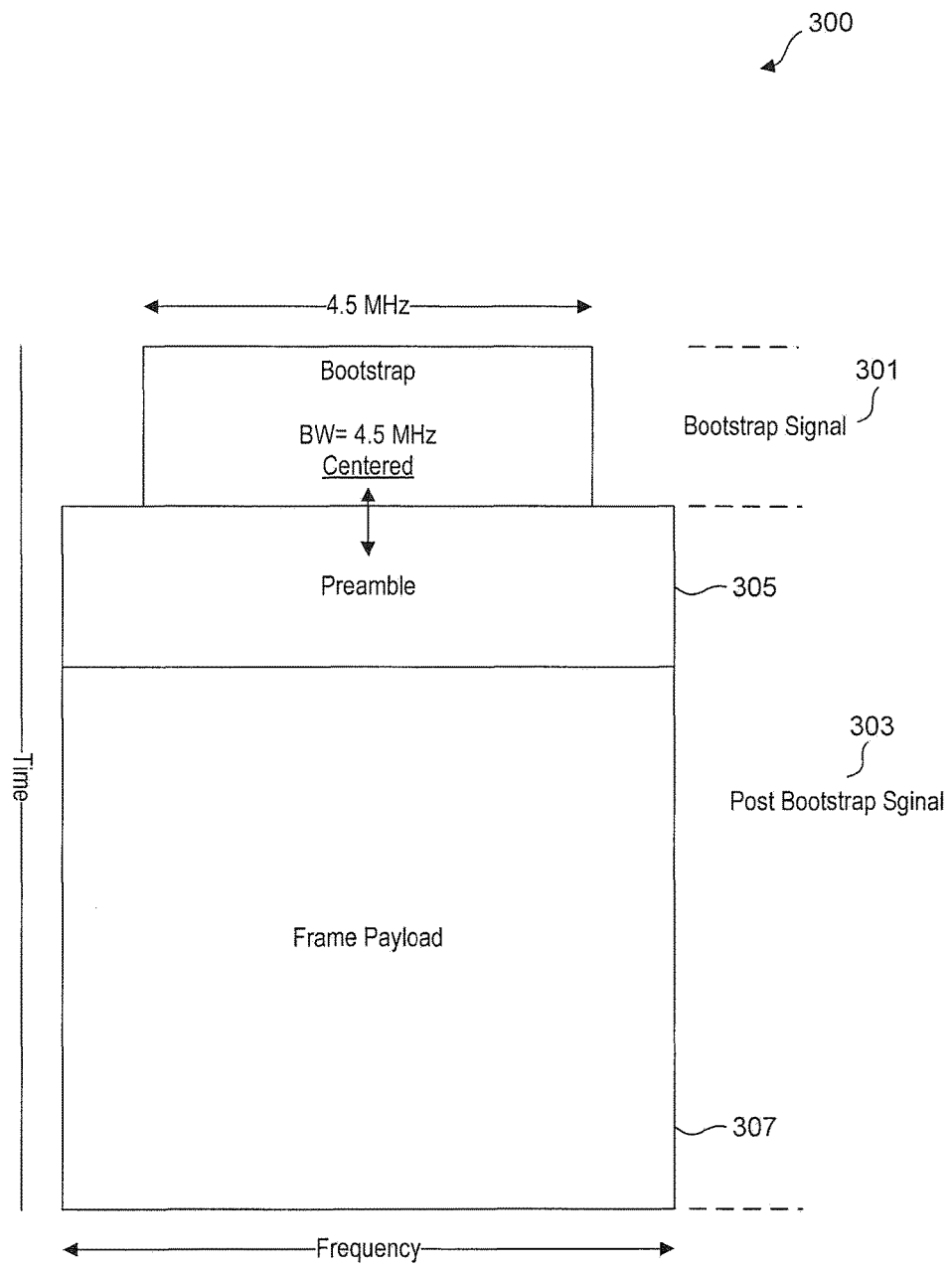
FIG. 3 illustrates a signal, according to an embodiment of the present disclosure.

FIG. 3 illustrates a signal 300, according to an embodiment of the present disclosure, which is also representative of the ATSC 3.0 standard which adopted the bootstrap, a non band-segmented version 301 in ATSC 3.0 standard A/321. Signal 300 (e.g., a data frame) includes a bootstrap signal 301 that contains signaling for a post bootstrap signal 303. Post bootstrap signal 303 can include a preamble 305 and a frame payload 307. In some embodiments, payload 307 can include data and/or services to be transmitted to a receiver and preamble 305 can include information about payload 307. According to some embodiments, bootstrap signal 301 can be created using system 200 of FIG. 2A.

According to some embodiments, the following design parameters can be used to generate bootstrap signal 301. For example, ZC sequence generator 207 of system 200 can use root value q=137 and ZC sequence length of $N_{ZC}$=1499 (a prime number). PN sequence generator 205 of system 200 can use a 16 bit LFSR with the generator polynomial discussed above in equation (3).

The baseband sampling rate (BSR) can be calculated as follows:

$$BSR = F_S = (N+16) \times M \qquad \text{Equ. (5)}$$

Here, $F_S$ is the sampling rate, N is an Operational Variable to scale over bandwidth chosen, and M is a factor (in MHz) to choose bandwidth. According to some embodiments, to calculate the sampling rate, N=0 and M=0.384 (e.g., because of an existing relationship of factor M to LTE (based on WCDMA)) sampling rate $F_S$. Accordingly, the sampling rate can be $F_S$=(0+16)×0.384=6.144 MHz.

The FFT size used in the IFFT module 221 of system 200 can be a power of 2, for example, 1024, 2048, 4096, 8192, etc. According to some embodiments, the FFT size is chosen to be 2048.

The OFDM subcarrier spacing (in Hz) is defined as:

$$\Delta F = \frac{F_S}{FFT\ size} \qquad \text{Equ. (6)}$$

Assuming a $N_{FFT}$=2048 point IFFT module 221 is used and sampling rate of 6.144 MHz, the subcarrier spacing ΔF=3 kHz.

According to this embodiment and based on the parameters discussed above, bootstrap signal 301 will have a bandwidth of 4.5 MHz which is smaller than the smallest 5 MHz LTE commonly used bandwidth, this along with selection of M is done not to preclude future compatibility with LTE:

BW=($N_{ZC}$+1)×ΔF=4.5 MHz. The 2048 IFFT is used but the center ($N_{ZC}$+1) or (1499+1) 1500 sub-carriers with ΔF are useful the remaining 548 are set to zero. 2048× ΔF would yield a bandwidth of 6.144 MHz without 548 being set to zero.

Also, each symbol in bootstrap signal 301 will have a time duration of 500 μs ($T_{symbol}$=500 μs.) after processing in sequencer module 223.

As a result, according to one embodiment, bootstrap signal 301 can consume a 4.5 MHz bandwidth and have subcarrier spacing ΔF=3 kHz, which can give very adequate Doppler performance (MPH) for broadcast band in mobile environment and be extended to higher frequency bands up to about 2 GHz not to preclude the future. As illustrated in FIG. 3, bootstrap signal 301 can be placed, in frequency domain, centered with respect to post bootstrap signal 303 the result of setting 548 sub-carriers to zero can be seen. According to some embodiments, bootstrap signal 301 can include four symbols. However, bootstrap signal 301 can include any other number of symbols.

Figure 4A:
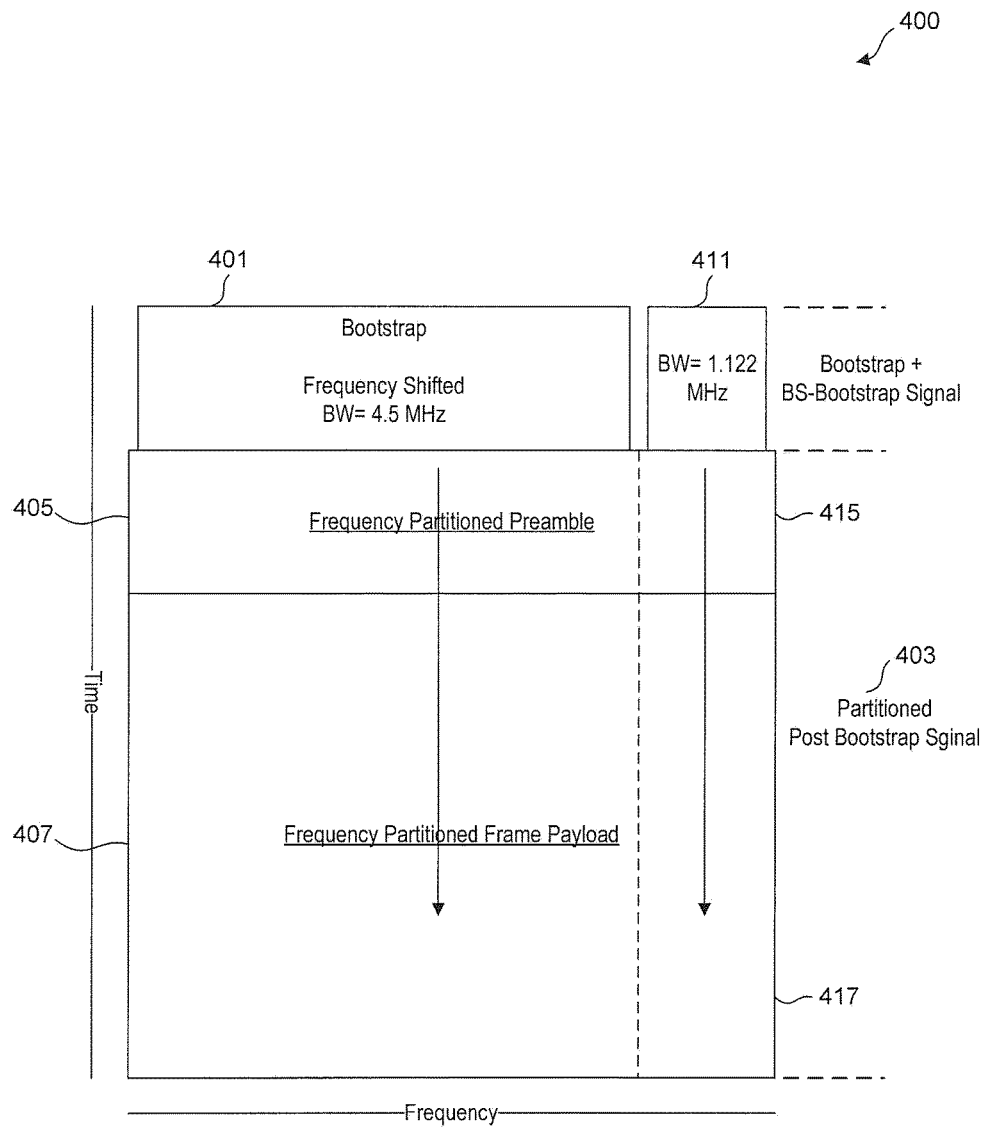
FIGS. 4A-4C illustrate signals, according to some embodiments of the present disclosure.

FIG. 4A illustrates a signal 400, according to an embodiment of the present disclosure. Signal 400 (e.g., a data frame) includes a bootstrap signal 401, a band segmented bootstrap signal 411, and a partitioned post bootstrap signal 403. Partitioned post bootstrap signal 403 can include a frequency partitioned preamble, which includes a first portion 405 and a second portion 415. Additionally, partitioned post bootstrap signal 403 can include a frequency partitioned frame payload, which includes a first portion 407 and a second portion 417. According to some embodiments, bootstrap signal 401 and band segmented bootstrap signal 411 can be created using system 250 of FIG. 2C. In some embodiments, partitioned post bootstrap signal 403 can be created using system 260 of FIG. 2D.

In this example, first portion 405 of the frequency partitioned preamble and first portion 407 of frequency partitioned frame payload are associated with and are aligned (in frequency) with bootstrap signal 401. Similarly, second portion 415 of the frequency partitioned preamble and second portion 417 of frequency partitioned frame payload are associated with and are aligned (in frequency) with band segmented bootstrap signal 411.

According to some embodiments, the design parameters discussed above with respect to FIG. 3 can be used by, for example, systems 200 and/or 250 to generate bootstrap signal 401. According to some embodiments, the following design parameters can be used to generate band segmented bootstrap signal 411. For example, ZC sequence generator 207 of system 200 and/or ZC sequence generator of system 250 can use ZC sequence length of $N_{ZC}$=373 (a prime number) and root value q=1, 2, 3, . . . , $N_{ZC}$−1. In this example, the ZC sequence generator has a lower coding gain (e.g., a quarter of what the bootstrap signal has or 12 dB less coding gain compared to the bootstrap signal 401). PN sequence generator 205 of system 200 and/or a PN sequence generator of system 250 can use a 16 bit LFSR with the generator polynomial discussed above in equation (3).

Given system 250 of FIG. 2C as an example, the sampling rate $F_S$ is 6.144 MHz, the common IFFT module 221 is 2048 point, and subcarrier spacing ΔF is 3000 Hz on the transmitter for bootstrap signal 401 and band segmented bootstrap signal 411. The baseband sampling rate (BSR) $F_S$ for the receiver device that receives the band segmented bootstrap signal 411 can be calculated as $F_S$=4×0.384=1.536 MHz. The FFT size used in the receiver device that receives the band segmented bootstrap signal 411 is 512 and can be seen that both $F_S$ and FFT size receiver have a reduction of 4 with respect to the transmitter. Assuming a receiver FFT size of 512 and sampling rate of 1.536 MHz, and the subcarrier spacing ΔF=3 kHz this enables power savings when the band segmented bootstrap 411 is received. However, the receiver of bootstrap signal 401 would not benefit from power savings and would use the same $F_S$ 6.144 MHz and FFT size 2048 as the transmitter 250.

According to this embodiment and based on the parameters discussed above, band segmented bootstrap signal 411 will have a bandwidth of:

$$BW=(N_{ZC}+1)\times\Delta F=1.122 \text{ MHz}.$$

Also, each symbol in band segmented bootstrap signal 411 will have a time duration of 500 μs ($T_{symbol}$=500 μs.) after processing by sequencer module 223. It is noted that these are exemplary values and other values can be used for, for example, ZC sequence length, root value, seed value PN sequence generator, FFT size, etc.

As a result, according to one embodiment, bootstrap signal 401 can consume a 4.5 MHz bandwidth and have a subcarrier spacing ΔF=3 kHz. Additionally, band segmented bootstrap signal 411 can consume a 1.122 MHz bandwidth and have a subcarrier spacing ΔF=3 kHz. In this embodiment, the total bandwidth of bootstrap signal 401 and band segmented bootstrap signal 411 is 4.5 MHz and 1.122 MHz, respectively, for a total of 5.622 MHz which will fit inside a 6 MHz channel with a useful bandwidth of 5.71 MHz in FIG. 4A. The bootstrap signal 401 is shifted to left and band segmented bootstrap signal 411 is added with zero subcarriers on each band edge and between bootstrap signal 401, band segmented bootstrap signal 411 as shown is signal 400 with common IFFT module 221 of FFT size of 2048 point as an example.

As illustrated in FIG. 4A, signal 400, using systems 250 and 260 as an example, can be sent and received on two independent partitioned channels. In other words, bootstrap signal 401, first portion 405 of the frequency partitioned preamble, and first portion 407 of frequency partitioned frame payload can be sent and received on one channel. Similarly, band segmented bootstrap signal 411, second portion 415 of the frequency partitioned preamble, and second portion 417 of frequency partitioned frame payload can be sent on another independent channel.

According to some embodiments, bootstrap signal 401 and/or band segmented bootstrap signal 411 can include four symbols. However, bootstrap signal 401 and/or band segmented bootstrap signal 411 can include any other number of symbols. In some embodiments, bootstrap signal 401 and/or band segmented bootstrap signal 411 can include OFDM symbols. Additionally or alternatively, partitioned post bootstrap signal 403 can include OFDM symbols.

According to some embodiments, guard bands (e.g., zero paddings) are provided between bootstrap signal 401 and band segmented bootstrap signal 411. Additionally or alternatively, no guard bands are provided between first portion 405 and second portion 415 of the frequency partitioned preamble. Also, no guard bands are provided between first portion 407 and second portion 417 of frequency partitioned frame payload, according to some embodiments.

Figure 4B:
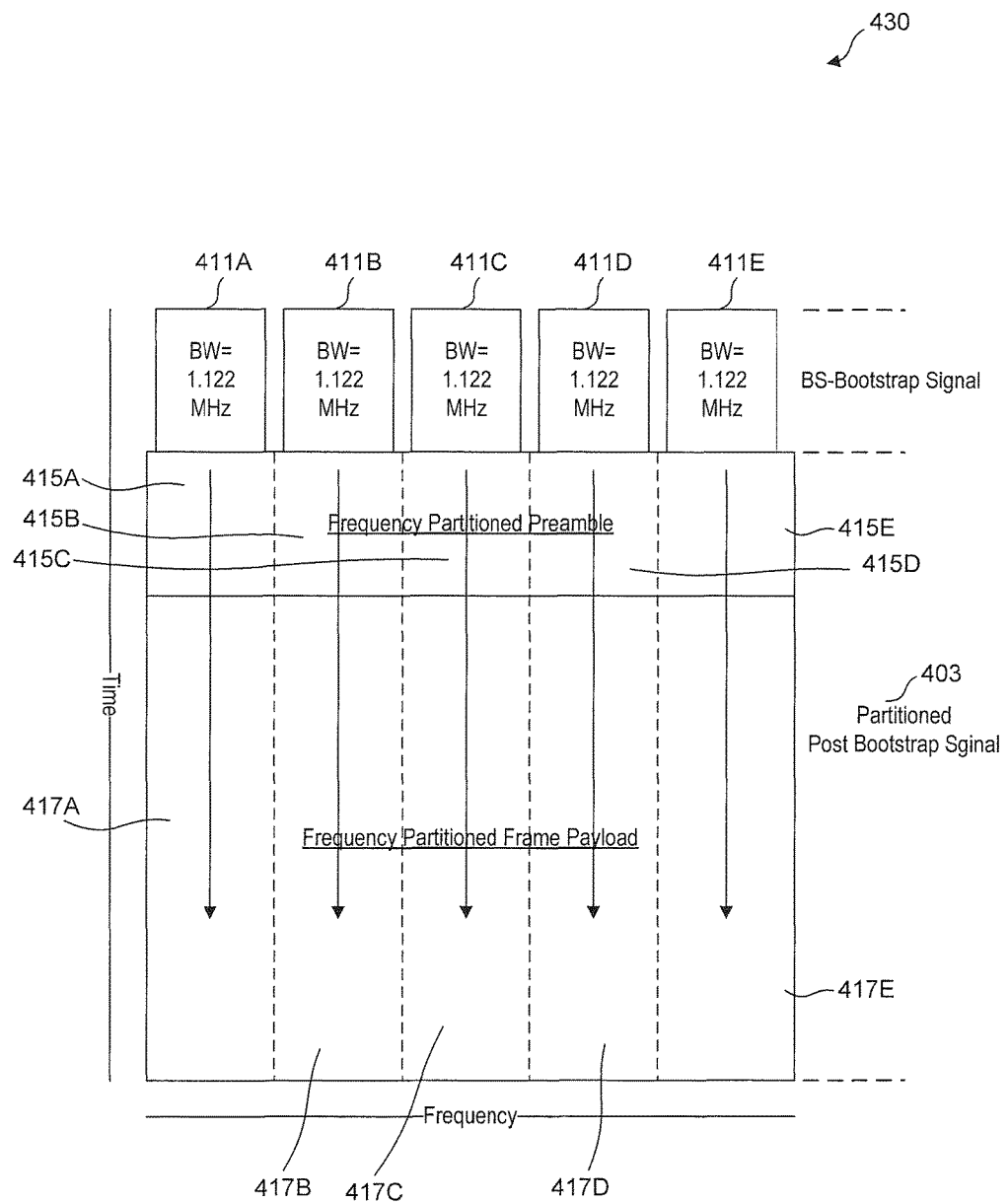

FIG. 4B illustrates a signal 430, according to an embodiment of the present disclosure. Signal 430 (e.g., a data frame) includes band segmented bootstrap signals 411A-E and a partitioned post bootstrap signal 403. Partitioned post bootstrap signal 403 can include a frequency partitioned preamble, which includes portions 415A-E. Additionally, partitioned post bootstrap signal 403 can include a frequency partitioned frame payload, which includes portions 417A-E. According to some embodiments, band segmented bootstrap signals 411A-E can be created using system 250 of FIG. 2C.

In this example, a first portion 415A of the frequency partitioned preamble and a first portion 417A of frequency partitioned frame payload are associated with and are aligned (in frequency) with band segmented bootstrap signal 411A. Similarly, a second portion 415B of the frequency partitioned preamble and a second portion 417B of frequency partitioned frame payload are associated with and are aligned (in frequency) with band segmented bootstrap signal 411B. A third portion 415C of the frequency partitioned preamble and a third portion 417C of frequency partitioned frame payload are associated with and are aligned (in frequency) with band segmented bootstrap signal 411C. A fourth portion 415D of the frequency partitioned preamble and a fourth portion 417D of frequency partitioned frame payload are associated with and are aligned (in frequency) with band segmented bootstrap signal 411D. And, a fifth portion 415E of the frequency partitioned preamble and a fifth portion 417E of frequency partitioned frame payload are associated with and are aligned (in frequency) with band segmented bootstrap signal 411E.

According to some embodiments, band segmented bootstrap signals 411A-E are independent narrow bandwidth signals inside a wider bandwidth signal and are generated similar to band segmented bootstrap signal 411 of FIG. 4A. In other words, for example, ZC sequence generator of system 250 can use ZC sequence length of $N_{ZC}$=373 (a prime number) and root value q=1, 2, 3, . . . , $N_{ZC}$−1. PN sequence generator of system 250 can use a 16 bit LFSR with the generator polynomial discussed above in equation (3). As an example, given system 250 of FIG. 2C, the transmitter sampling rate $F_S$ is 6.144 MHz, the common IFFT module 221 has an FFT size of 2048 point, and the subcarrier spacing ΔF is 3000 Hz. The baseband sampling rate (BSR) $F_S$ on the receiver device that receives either one of band segmented bootstrap signal 411A-E for example can be calculated as $F_S=4\times0.384=1.536$ MHz. The FFT size on the receiver of either one of band segmented bootstrap signal 411A-E can be chosen to be 512. Assuming a receiver FFT size of 512 and sampling rate of 1.536 MHz, the subcarrier spacing is $\Delta F=3$ kHz. Band segmented bootstrap signals 411A-E will have a bandwidth of $BW=(N_{ZC}+1)\times\Delta F=1.122$ MHz and each will benefit from power savings reception with reduced $F_S$ and FFT with respect to transmitter.

Also, each symbol in band segmented bootstrap signals 411A-E will have a time duration of 500 μs ($T_{symbol}=500$ μs) after processing by sequencer module 223. It is noted that these are exemplary values and other values can be used for, for example, ZC sequence length, root value, seed value PN of sequence generator, FFT size, etc. In this example, the band segmented bootstrap signals 411A-E are generated but received by scaling the FFT size and sampling rate and keeping subcarrier spacing constant compared to parameters used to generate bootstrap signals to achieve power savings.

According to some embodiments, partitioned post bootstrap signal 403 can be generated using system 260 of FIG. 2D. In some embodiments, each segment of partitioned post bootstrap signal 403 (e.g., a first portion 415A of the frequency partitioned preamble and a first portion 417A of frequency partitioned frame payload) can be generated using a common IFFT module 273 with FFT size of 8196, sampling frequency of $F_S=6912$ MHz, and subcarrier spacing of $\Delta F$ 843.75 Hz, by for example system 260. In this embodiment, each segment of partitioned post bootstrap signal 403 can be received using a FFT size 2048 and sampling rate of 1.728 MHz and the subcarrier spacing $\Delta F=843.75$ Hz and can benefit from power savings and spectrum efficiency of no guard bands between partitioned post bootstrap segments 403.

As illustrated in FIG. 4B, signal 430 can be sent and received on five independent partitioned channels. In other words, band segmented bootstrap signal 411A (with signaling for first portion 415A and second portion 417A), first portion 415A of the frequency partitioned preamble, and first portion 417A of frequency partitioned frame payload can be sent and received on one channel. Similarly, band segmented bootstrap signal 411B (with signaling for first portion 415B and second portion 417B), second portion 415B of the frequency partitioned preamble, and second portion 417B of frequency partitioned frame payload can be sent on another independent channel. Band segmented bootstrap signal 411C (with signaling for first portion 415C and second portion 417C), third portion 415C of the frequency partitioned preamble, and third portion 417C of frequency partitioned frame payload can be sent on a third independent channel. Band segmented bootstrap signal 411D (with signaling for first portion 415D and second portion 417D), fourth portion 415D of the frequency partitioned preamble, and fourth portion 417D of frequency partitioned frame payload can be sent on a fourth independent channel. And band segmented bootstrap signal 411E (with signaling for first portion 415E and second portion 417E), fifth portion 415E of the frequency partitioned preamble, and fifth portion 417E of frequency partitioned frame payload can be sent on a fifth independent channel.

According to some embodiments, one or more of band segmented bootstrap signals 411A-E can include four symbols. However, band segmented bootstrap signals 411A-E can include any other number of symbols which include signaling for partitioned post bootstrap signal 403.

Also, although only five band segmented bootstrap signals 411A-E are illustrated in FIG. 4B, signal 430 can include any number of bootstrap signals and/or band segmented bootstrap signals. According to one embodiment, the number of bootstrap signals and/or band segmented bootstrap signals can depend on the bandwidth of the bootstrap signals and/or band segmented bootstrap signals and the total bandwidth of signal 430. In the embodiment of FIG. 4B, the total useful bandwidth of signal 430 of a 6 MHz channel can be 5.71 MHz and the bandwidth of each of the band segmented bootstrap signals 411 is 1.122 MHz. Accordingly, signal 430 includes five band segmented bootstrap signals (and associated preamble and frame payload). In some embodiments, band segmented bootstrap signal 411A-E can include can include OFDM symbols. Additionally or alternatively, partitioned post bootstrap signal 403 can include OFDM symbols.

According to some embodiments, guard bands (e.g., zero paddings) are provided between band segmented bootstrap signals 411A-E. Additionally or alternatively, no guard bands are provided between portion 417A-E of frequency partitioned frame payload, according to some embodiments.

Figure 4C:
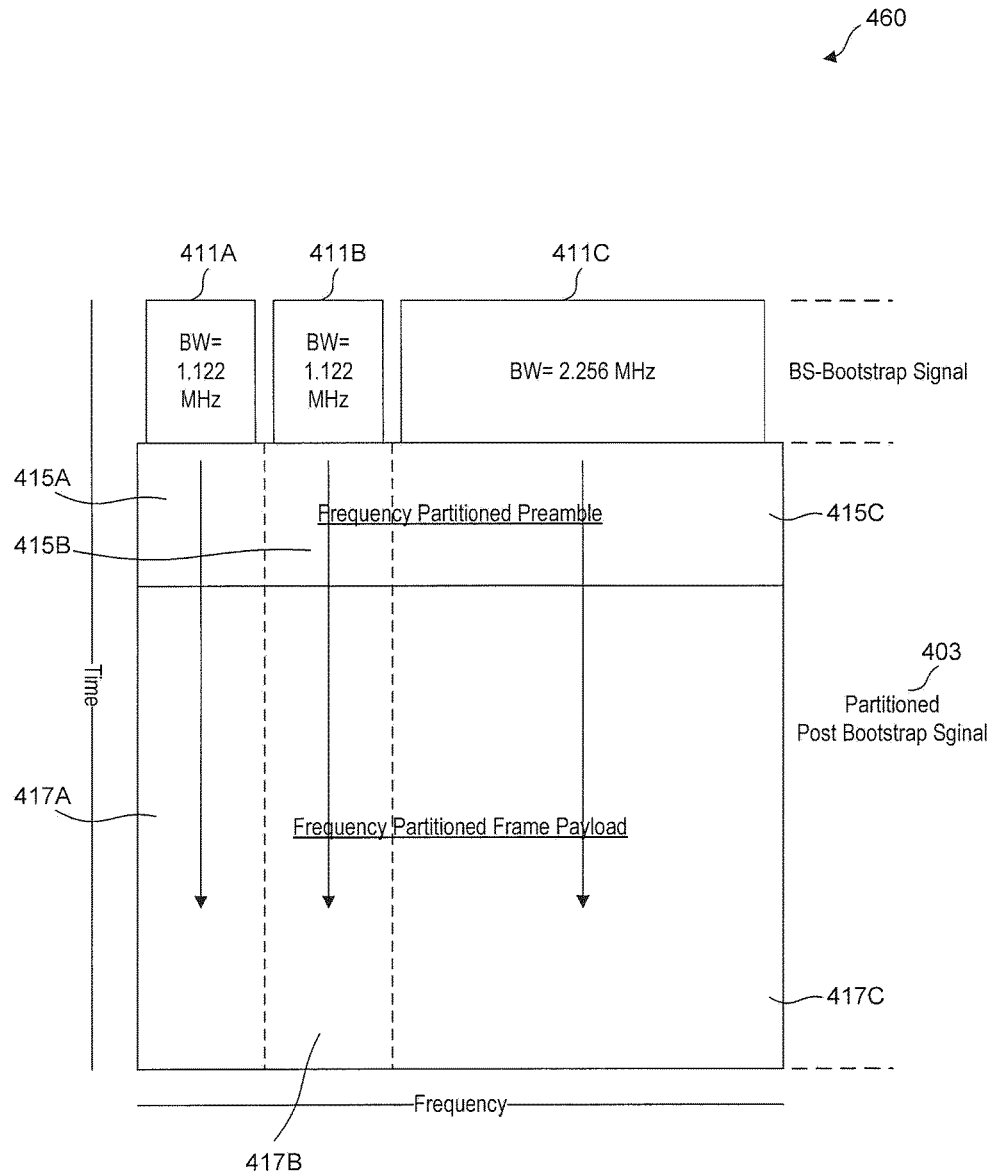

FIG. 4C illustrates a signal 460, according to an embodiment of the present disclosure. Signal 460 (e.g., a data frame) includes band segmented bootstrap signals 411A-C and a partitioned post bootstrap signal 403. Partitioned post bootstrap signal 403 can include a frequency partitioned preamble, which includes portions 415A-C. Additionally, partitioned post bootstrap 403 can include a frequency partitioned frame payload, which includes portions 417A-C. According to some embodiments, band segmented bootstrap signals 411A-C can be created using system 250 of FIG. 2C.

In this example, a first portion 415A of the frequency partitioned preamble and a first portion 417A of frequency partitioned frame payload are associated with and are aligned (in frequency) with band segmented bootstrap signal 411A. Similarly, a second portion 415B of the frequency partitioned preamble and a second portion 417B of frequency partitioned frame payload are associated with and are aligned (in frequency) with band segmented bootstrap signal 411B. A third portion 415C of the frequency partitioned preamble and a third portion 417C of frequency partitioned frame payload are associated with and are aligned (in frequency) with band segmented bootstrap signal 411C.

According to some embodiments, band segmented bootstrap signals 411A and 411B are generated similar to band segmented bootstrap signal 411 of FIG. 4A. In other words, for example, ZC sequence generator of system 250 can use ZC sequence length of $N_{ZC}=373$ (a prime number) and root value $q=1, 2, 3, \ldots N_{ZC}-1$. PN sequence generator of system 250 can use a 16 bit LFSR with the generator polynomial discussed above in equation (3). The baseband sampling rate (BSR) $F_S$ of the receiver device that receives band segmented bootstrap signals 411A or 411B can be calculated as $F_S=4\times0.384=1.536$ MHz. The FFT size used in the receiver device that receives band segmented bootstrap signals 411A or 411B is 512. In other words, the receiver, assuming an FFT size of 512, sampling rate of 1.536 MHz, and the subcarrier spacing $\Delta F=3$ kHz, will benefit from power savings. Band segmented bootstrap signals 411A and 411B will have a bandwidth of $BW=(N_{ZC}+1)\times\Delta F=1.122$ MHz. Also, each symbol in band segmented bootstrap signals 411A and 411B will have a time duration of 500 μs ($T_{symbol}=500$ μs) after processing by sequencer module 223.

According to some embodiments, the following design parameters can be used to generate band segmented bootstrap signal 411C. For example, ZC sequence generator of system 250 can use ZC sequence length of $N_{ZC}=751$ sample (a prime number) and a root value $q=1, 2, 3, \ldots, N_{ZC}-1$.

In this example, the ZC sequence generator has a lower coding gain (e.g., a quarter of what the bootstrap signal has or 6 dB less coding gain compared to the bootstrap signal 401). PN sequence generator of system 250 can use a 16 bit LFSR with the generator polynomial discussed above in equation (3).

The baseband sampling rate (BSR) $F_S$ of the receiver device that receives band segmented bootstrap signals 411C can be calculated as $F_S$=8×0.384=3.072 MHz. The FFT size used in the receiver device that receives band segmented bootstrap signals 411C can be chosen to be 1024. Assuming an FFT size of 1024 and sampling rate of 3.072 MHz, the subcarrier spacing can be ΔF=3 kHz. Accordingly, the receiver that receives band segmented bootstrap signals 411C can benefit from power savings by using FFT size 1024 and $F_S$ 3.072 MHz which is 50% of that of transmitter (for example system 250) which has FFT size 2048 and $F_S$=6.144 MHz.

According to this example and based on the parameters discussed above, band segmented bootstrap signal 411C will have a bandwidth of:

$$BW=(N_{ZC}+1)\times\Delta F=2.256 \text{ MHz}.$$

Also, each symbol in band segmented bootstrap signal 411C will have a time duration of 500 μs ($T_{symbol}$=500 μs) after processing by sequencer module 223. It is noted that these are exemplary values and other values can be used for, for example, ZC sequence length, root value, seed value, PN sequence generator, FFT size, or other parameters used in generating band segmented bootstrap signals and partitioned post bootstrap signals.

As a result, according to one embodiment, band segmented bootstrap signals 411A and 411B can consume a 1.122 MHz bandwidth and have a subcarrier spacing ΔF=3 kHz. Additionally, band segmented bootstrap signal 411C can consume a 2.256 MHz bandwidth and have a subcarrier spacing ΔF=3 kHz. The total bandwidth of band segmented bootstrap signals 411A, 411B, and 411C is 4.5 MHz which can fit inside useful bandwidth 5.71 MHz of 6 MHz channel and will use zero sub-carriers as padding between and on edges as shown 460.

According to some embodiments, partitioned post bootstrap signal 403 can be generated using system 260 of FIG. 2D.

As illustrated in FIG. 4C, signal 460 can be sent and received as three independent partitioned channels. In other words, band segmented bootstrap signal 411A, first portion 415A of the frequency partitioned preamble, and first portion 417A of frequency partitioned frame payload can be sent and received on one channel. Similarly, band segmented bootstrap signal 411B, second portion 415B of the frequency partitioned preamble, and second portion 417B of frequency partitioned frame payload can be sent on another independent channel. And band segmented bootstrap signal 411C, third portion 415C of the frequency partitioned preamble, and third portion 417C of frequency partitioned frame payload can be sent on another independent channel.

According to some embodiments, one or more of band segmented bootstrap signals 411A-C can include four symbols. However, band segmented bootstrap signals 411A-C can include any other number of symbols which can carry signaling for discovery of 403. In some embodiments, band segmented bootstrap signals 411A-C can include OFDM symbols. Additionally or alternatively, partitioned post bootstrap signal 403 can include OFDM symbols.

Also, although only three band segmented bootstrap signals 411A-C are illustrated in FIG. 4C, signal 460 can include any number of bootstrap signals and/or band segmented bootstrap signals. As discussed above, the number of bootstrap signals and/or band segmented bootstrap signals can depend on the bandwidth of the bootstrap signals and/or band segmented bootstrap signals and the total bandwidth of signal 460.

According to some embodiments, guard bands (e.g., zero paddings) are provided between band segmented bootstrap signals 411A-C because as previously discussed $N_{ZC}$ can be a prime number. Additionally or alternatively, no guard bands are provided between portion 417A-C of frequency partitioned frame payload, according to some embodiments.

Figure 5:
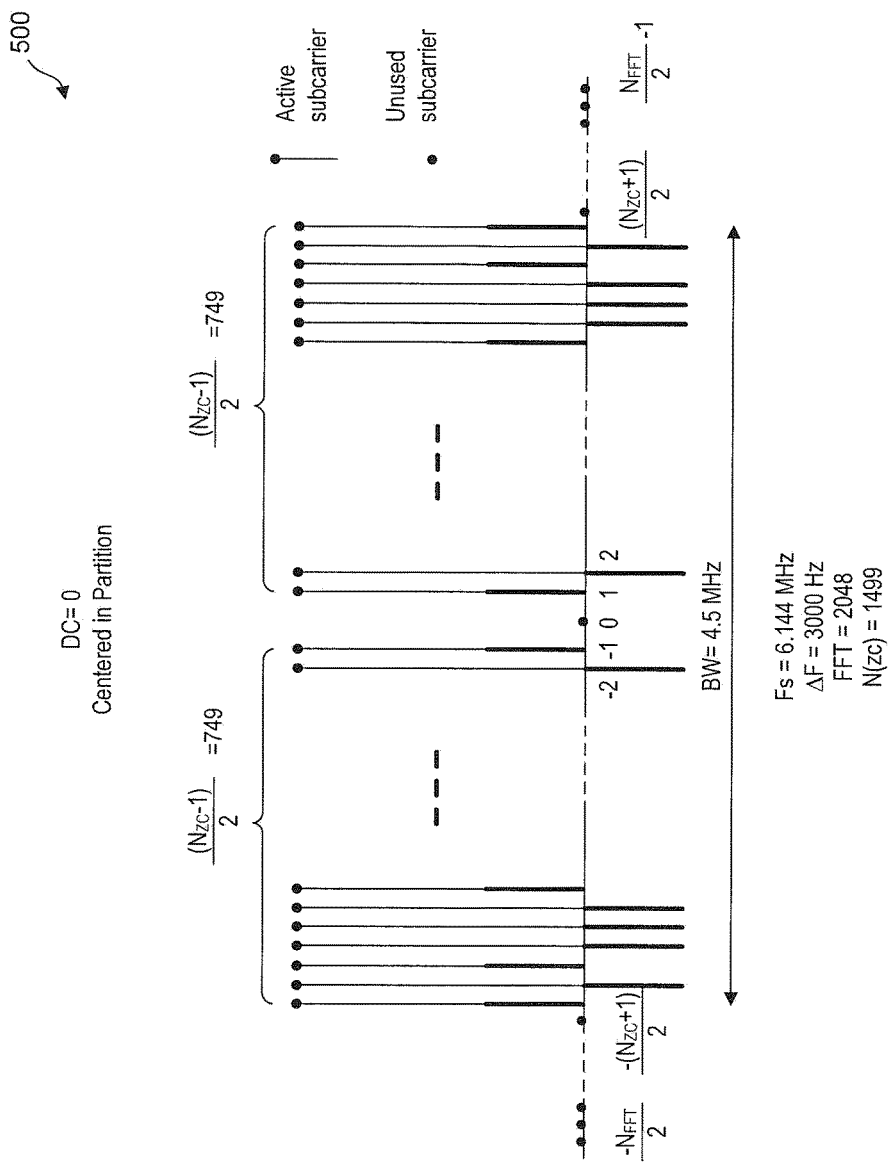
FIG. 5 is an example illustration of a mapping of frequency domain sequence to subcarriers, according to an embodiment of the present disclosure.

FIG. 5 is an example illustration of the mapping 500 of frequency domain sequence to subcarriers, according to an embodiment of this disclosure. According to some embodiments, the mapping 500 can be performed by mapping module 219 of FIG. 2A.

According to some embodiments, the ZC sequence value that maps to the direct current (DC) subcarrier (i.e., $z_q((N_{ZC}-1)/2)$) is set to zero so that the DC subcarrier is null. The subcarrier indices are illustrated with the central DC subcarrier having index 0. The product of the ZC and the PN sequences can have reflective symmetry about the DC subcarrier. The ZC sequence can have a natural reflective symmetry about the DC subcarrier. A reflective symmetry of the PN sequence about the DC subcarrier can be introduced by mirror-reflecting the PN sequence values assigned to subcarriers below the DC subcarrier to the subcarriers above the DC subcarrier. For example, the PN sequence values at subcarriers −1 and +1 are identical, as are the PN sequence values at subcarriers −2 and +2. As a result, the product of the ZC and PN sequences can also have reflective symmetry about the DC subcarrier.

The symmetry described herein enables a more robust signal, making it easier to discover. In particular, the symmetry acts as an additional aid for discovery (e.g., additional gain). This is an additional feature of the signal that the receiver (e.g., receiver 112 of FIG. 1) can look for, making it easier to find. Thus, it is one of the elements that allows the bootstrap signal and/or band segmented bootstrap signals to be recognized even below the noise floor.

According to some embodiments, mapping 500, which can be performed by mapping module 219 of FIG. 2A, is for a bootstrap signal created based on design parameters discussed with respect to FIG. 3. In other words, for a bootstrap signal with BW=4.5 MHz, $F_S$=6.144 MHz, ΔF=3 kHz, FFT size ($N_{FFT}$)=2048, and $N_{ZC}$=1499. In one example, mapping 500 represents the sub-carrier mapping adopted in A/321 of ATSC 3.0 Standard.

Figure 6A:
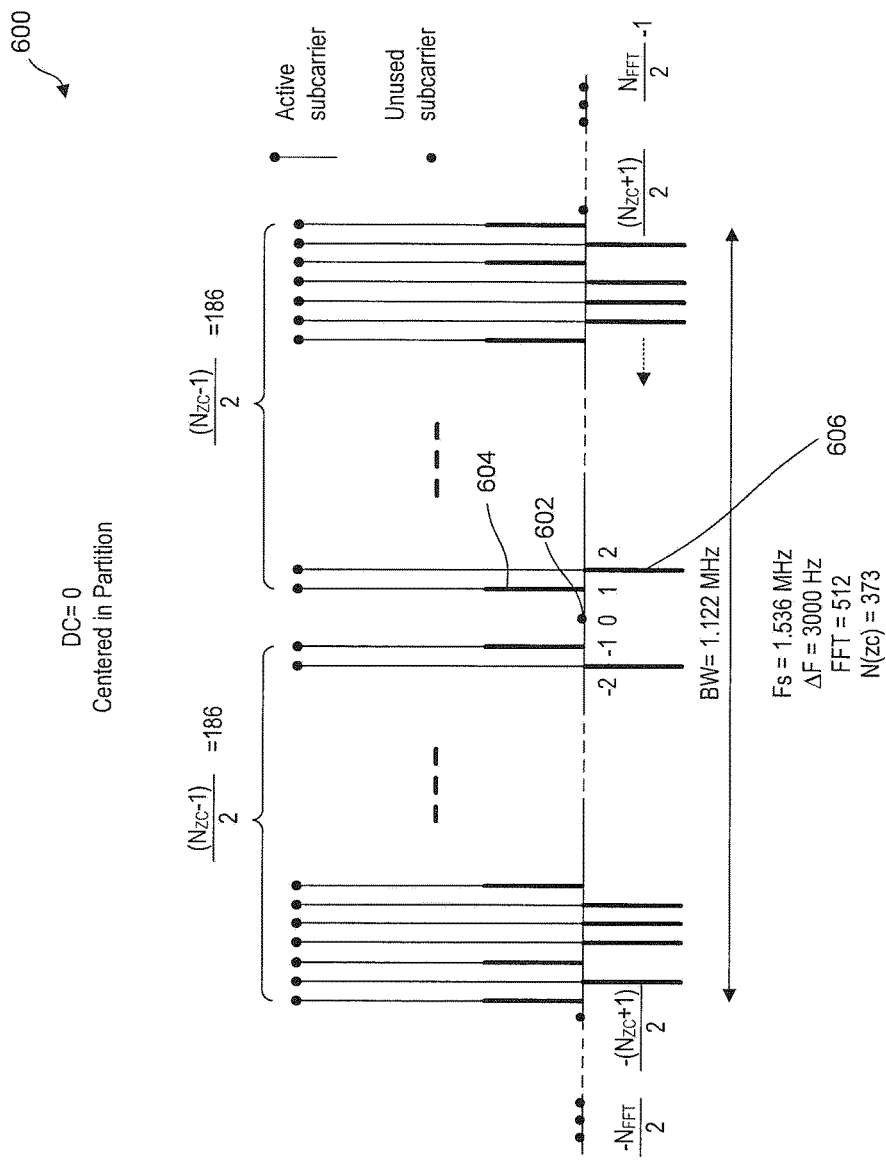
FIGS. 6A-6B are example illustrations of mappings of frequency domain sequence to subcarriers, according to an embodiment of the present disclosure.

FIG. 6A is an example illustration of the mapping 600 of frequency domain sequence to subcarriers, according to an embodiment of this disclosure. According to some embodiments, the mapping 600 can be performed by mapping module 219 of FIG. 2C. According to some embodiments, mapping 600 is similar to mapping 500 of FIG. 5 except that mapping 600 can be for a band segmented bootstrap signal created based on design parameters discussed with respect to band segmented bootstrap signals 411 of FIG. 4A, band segmented bootstrap signals 411A-E of FIG. 4B, and band segmented bootstrap signals 411A and B of FIG. 4C. In other words, for a band segmented bootstrap signal with $N_{ZC}$=373 and BW=1.122 MHz, and for a receiver device (that receives the band segmented bootstrap) with $F_S$=1.536 MHz, ΔF=3 kHz, FFT size ($N_{FFT}$)=512.

Figure 6B:
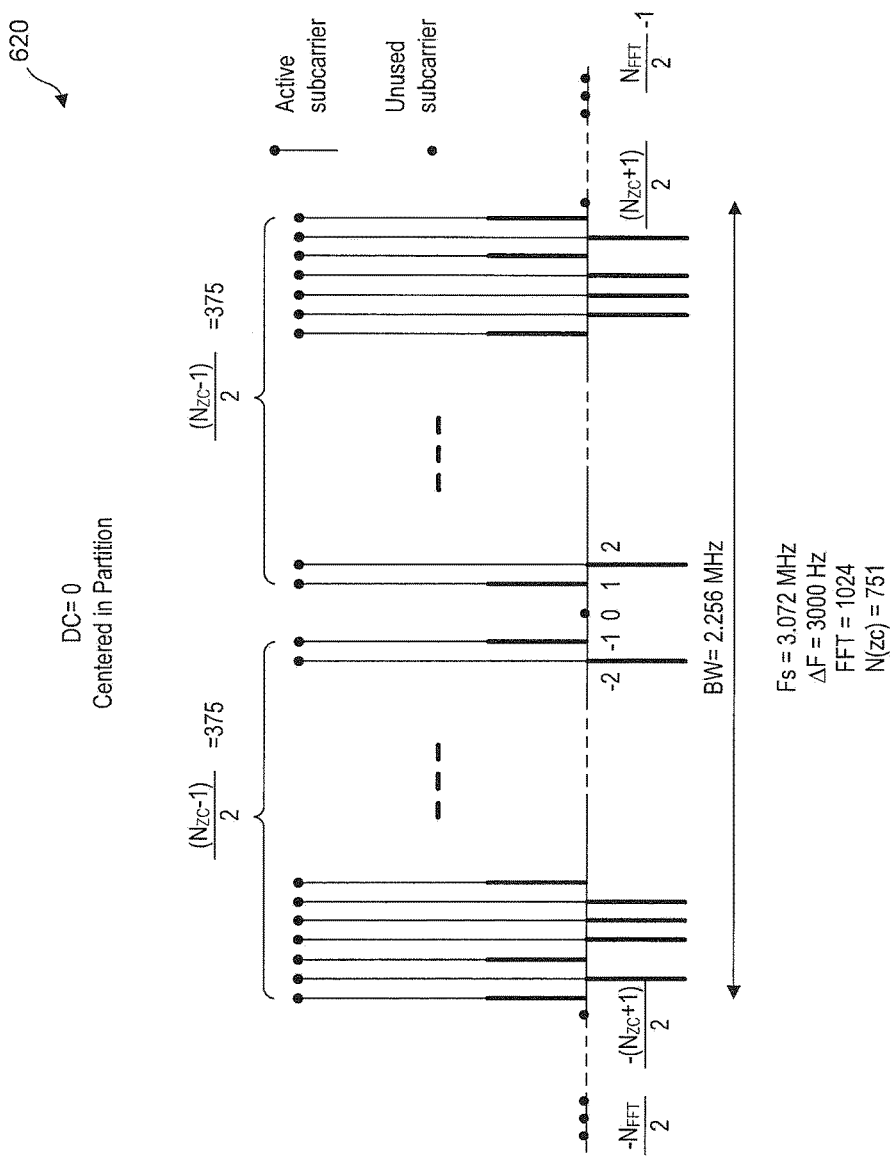

FIG. 6B is an example illustration of the mapping 620 of frequency domain sequence to subcarriers, according to an embodiment of this disclosure. According to some embodiments, the mapping 620 can be performed by mapping module 219 of FIG. 2C. According to some embodiments, mapping 620 is similar to mappings 500 of FIG. 5 and 600 of FIG. 6A, except that mapping 620 can be for a band segmented bootstrap signal created based on design parameters discussed with respect to band segmented bootstrap signal 411C of FIG. 4C. In other words, for a band segmented bootstrap signal with $N_{ZC}$=751 and BW=2.256 MHz, and for a receiver device (that receives the band segmented bootstrap) with $F_S$=3.072 MHz, ΔF=3 kHz, FFT size=1024.

According to some examples, as the mappings 500, 600, and 620 illustrate, the subcarrier values for the n-th symbol of the bootstrap signal and/or band segmented bootstrap signal ($0 \leq n < N_s$) can be expressed as:

$$s_n(k) = \begin{cases} z_q(k+N_H) \times c((n+1) \times N_H + k) & -N_H \leq k \leq -1 \\ z_q(k+N_H) \times c((n+1) \times N_H - k) & 1 \leq k \leq N_H \\ 0 & \text{otherwise} \end{cases} \quad \text{Equ. (7)}$$

where $$N_H = \frac{N_{ZC} - 1}{2},$$

and $c(k)=12 \times p(k)$, with $c(k)$ having either the value +1 or −1. As illustrated in FIG. 6A, mapped value 602 at DC subcarrier is zero. Mapped value 604 at subcarrier +1 can be $s_n(1)$. Also, mapped value 606 at subcarrier +2 is $s_n(2)$. It should be appreciated that the ZC sequence is the same for each symbol, while the PN sequence advances with each symbol.

In one embodiment, the final symbol in the bootstrap signal and/or the band segmented bootstrap signal is indicated by a phase inversion (i.e., a rotation of 180°) of the subcarrier values for that particular symbol. This bootstrap and/or band segmented bootstrap termination signaling enables extensibility by allowing the number of symbols in the bootstrap signal and/or the band segmented bootstrap signal to be increased for additional signaling capacity in a backwards compatible manner without requiring the major or minor version numbers to be changed. The phase inversion simply involves multiplying each subcarrier value by $e^{j\pi}=-1$:

$$\tilde{s}_n(k) = \begin{cases} s_n(k) & 0 \leq n < N_s - 1 \\ -s_n(k) & n = N_s - 1 \end{cases} \quad \text{Equ. (8)}$$

This phase inversion enables receivers (such as receivers 112 of FIG. 1) to correctly determine the end point of the bootstrap signal and/or the band segmented bootstrap signal. For example, a receiver determines the endpoint of a bootstrap signal and/or a band segmented bootstrap signal for a minor version that is later than the minor version for which the receiver was designed and that has been extended by one or more bootstrap symbols and/or the band segmented bootstrap symbols. As a result, receivers do not need to assume a fixed number of bootstrap symbols and/or band segmented bootstrap symbols. In addition, receivers can ignore the signaling bit contents of a bootstrap symbol and/or a band segmented bootstrap symbol that the receiver has not been provisioned to decode but still detect the presence of the symbol itself.

Once mapped, the frequency domain sequence is then translated to the time domain using, for example, IFFT module 221. According to one example, the frequency domain sequence of the mapping 500 is translated to the time domain using a $N_{FFT}$=2048 point IFFT module 221. According to another example, as shown in FIGS. 4A, 4B, and 4C, a combination of band segmented bootstrap signals with a combined bandwidth less than the channel useful bandwidth such as 5.7 MHz can use sampling rate of $F_S$=6.144 MHz and common IFFT module 221 of system 250 with an FFT size of 2048, as previously discussed.

The complex-valued time domain sequence $\tilde{A}_n(t)$ of IFFT 221 can be presented as follows:

$$\tilde{A}_n(t) = \frac{1}{sqrt(N_{ZC})} \left( \sum_{k=-\frac{(N_{ZC}-1)}{2}}^{-1} \tilde{s}_n(k) e^{j2\pi k f \Delta t} + \sum_{k=1}^{\frac{(N_{ZC}-1)}{2}} \tilde{s}_n(k) e^{j2\pi k f \Delta t} \right) \quad \text{Equ. (9)}$$

Information is signaled via the bootstrap symbols and/or the band segmented bootstrap symbols through the use of cyclic shifts in the time domain of the $\tilde{A}_n(t)$ time domain sequence. According to some embodiments, cyclic shift module 217 is configured to generate the cyclic shift. As discussed above, the cyclic shift can be applied in frequency domain which is then translated into a delay in auto-correlation after IFFT 221 in time domain which is used to convey the signaling information or cyclic shift can be applied directly in time domain which also results in a delay of auto-correlation used to convey signaling.

According to some embodiments, the time domain sequence $\tilde{A}_n(t)$ is generated using a $N_{FFT}$=2048 point IFFT module 221. In this case, time domain sequence $\tilde{A}_n(t)$ has a length of $N_{FFT}$=2048. Therefore, 2048 distinct cyclic shifts or delays in auto-correlation detected at receiver for signaling can be possible (from 0 to 2047, inclusive). With 2048 possible cyclic shifts, up to $\log_2 (2048)=11$ bits can be signaled. According to some embodiments, not all of these bits will actually be used. For example, 8 bits can be used for signaling and the rest of the bits can be used for tolerance for error. In this example, the tolerance can be around 24 KHz (2048/256*3000 Hz) stated in frequency domain, which translates to 8 samples $T_S$ tolerance for error in time domain, which is the same design parameter for tolerance as used in A/321. In one example, $N_b{}^n$ represents the number of signaling bits that can used for the n-th bootstrap symbol ($1 \leq n < N_s$), and $b_o{}^n, \ldots, b_{N_b{}^n-1}{}^n$ represent the values of those bits. Each of the valid signaling bits $b_o{}^n, \ldots, b_{N_b{}^n-1}{}^n$ can have a value 0 or 1. Each of the remaining signaling bits $b_{N_b{}^n}{}^n, \ldots, b_{10}{}^n$ will be set to 0.

According to some embodiments, the time domain sequence $\tilde{A}_n(t)$ 411C of FIG. 4C is received by a receiver device having a $N_{FFT}$=1024 point FFT module. In this case, time domain sequence $\tilde{A}_n(t)$ has a length of $N_{FFT}$=1024. Therefore, 1024 distinct cyclic shifts can be possible (from 0 to 1023, inclusive). With 1024 possible cyclic shifts, up to time domain sequence $\log_2 (1024)=10$ bits can be signaled. According to some embodiments, not all of these bits will actually be used. For example, 7 bits can be used for signaling and the rest of the bits can be used for tolerance for error. In this example, the tolerance can be around 24 KHz (1024/128*3000 Hz), which is the same design parameter for tolerance as used in A/321. In one example, $N_b^n$ represents the number of signaling bits that can used for the n-th symbol of the band segmented bootstrap signal ($1 \leq n < N_s$), and $b_o^n, \ldots, b_{N_b^n-1}^n$ represent the values of those bits. Each of the valid signaling bits $b_o^n, \ldots, b_{N_b^n-1}^n$ can have a value 0 or 1. Each of the remaining signaling bits $b_{N_b^n}^n, \ldots, b_9^n$ will be set to 0.

According to some embodiments, the time domain sequence $\tilde{A}_n(t)$ 411A of FIG. 4B or FIG. 4C is received by a receiver device having a $N_{FFT}=512$ point FFT module. In this case, time domain sequence $\tilde{A}_n(t)$ has a length of $N_{FFT}=512$. Therefore, 512 distinct cyclic shifts can be possible (from 0 to 511, inclusive). With 512 possible cyclic shifts, up to time domain sequence $\log_2(512)=9$ bits can be signaled. According to some embodiments, not all of these bits will actually be used. For example, 6 bits can be used for signaling and the rest of the bits can be used for tolerance for error. In this example, the tolerance can be around 24 KHz (512/64*3000 Hz), which is the same design parameter for tolerance as used in A/321. In one example, $N_b^n$ represents the number of signaling bits that can used for the n-th symbol of the band segmented bootstrap signal ($1 \leq n < N_s$), and $b_o^n, \ldots, b_{N_b^n-1}^n$ represent the values of those bits. Each of the valid signaling bits $b_o^n, \ldots, b_{N_b^n-1}^n$ can have a value 0 or 1. Each of the remaining signaling bits $b_{N_b^n}^n, \ldots, b_8^n$ will be set to 0.

The operation of cyclic shift module 217 is discussed below with respect to a band segmented bootstrap signal generated using a $N_{FFT}=2048$ point IFFT module 221 of FIG. 2C, according to one exemplary embodiment. However, the embodiments of this disclosure can be extended a band segmented bootstrap signal generated using a $N_{FFT}=1024$ point IFFT module 221 and/or a bootstrap signal generated using a $N_{FFT}=512$ point IFFT module 221.

In one embodiment also representative of A/321, a cyclic shift is represented as $\tilde{M}_n$ ($0 \leq \tilde{M}_n < N_{FFT}$) for the nth symbol ($1 \leq n < N_s$) of the band segmented bootstrap signal relative to the cyclic shift for the previous symbol of the band segmented bootstrap signal. $\tilde{M}_n$ is calculated from the signaling bit values for the n-th symbol of the band segmented bootstrap signal using a Gray code method. $\tilde{M}_n$ is represented in binary form as a set of bits $m_{10}^n m_9^n \ldots m_1^n m_0^n$. Each bit of $\tilde{M}_n$ can be computed as follows:

$$m_t^n = \begin{cases} \left(\sum_{k=0}^{10-t} b_k^n\right) \bmod 2 & t > 10 - N_b^n \\ 1 & t = 10 - N_b^n \\ 0 & t < 10 - N_b^n \end{cases} \quad \text{Equ. (10)}$$

where the summation of the signaling bits followed by the modulo operation effectively performs a logical exclusive OR operation on the signaling bits in question.

This equation ensures that the relative cyclic shift $\tilde{M}_n$ is calculated to provide the maximum tolerance to any errors at the receiver when estimating the relative cyclic shift for a received bootstrap symbol and/or a received symbol of a band segmented bootstrap signal. If the number of valid signaling bits $N_b^n$ for a specific bootstrap symbol and/or a symbol of a band segmented bootstrap signal is increased in a future minor version within the same major version, the equation also ensures that the relative cyclic shifts for that future minor version symbol can be calculated. The relative cyclic shifts for that future minor version symbol will be calculated in such a manner that will still allow a receiver provisioned for an earlier minor version to correctly decode the signaling bit values that it is provisioned to decode, and hence backward compatibility will be maintained.

It should be appreciated that in general, the expected robustness of signaling bit $b_i^n$ will be greater than that of $b_k^n$ if i<k.

In one embodiment, the first symbol of the bootstrap signal and/or the band segmented bootstrap signal is used for initial time synchronization and signals the major and minor version numbers via the ZC-root and PN-seed parameters. This symbol does not signal any additional information and hence can have a cyclic shift of 0, according to some embodiments.

The differentially-encoded absolute cyclic shift, $M_n$ ($0 \leq M_n < N_{FFT}$), applied to the nth symbol is calculated by summing the absolute cyclic shift for symbol n−1 and the relative cyclic shift for symbol n, modulo the length of the time domain sequence:

$$M_n = \begin{cases} 0 & n = 0 \\ (M_{n-1} + \tilde{M}_n) \bmod N_{FFT} & 1 \leq n < N_S \end{cases} \quad \text{Equ. (11)}$$

The absolute cyclic shift is then applied to the complex-value time domain sequence to obtain the shifted time domain sequence from the output of the IFFT operation:

$$A_n(t) = \tilde{A}_n((t+M_n) \bmod N_{FFT}) \quad \text{Equ. (12)}$$

Figure 7:
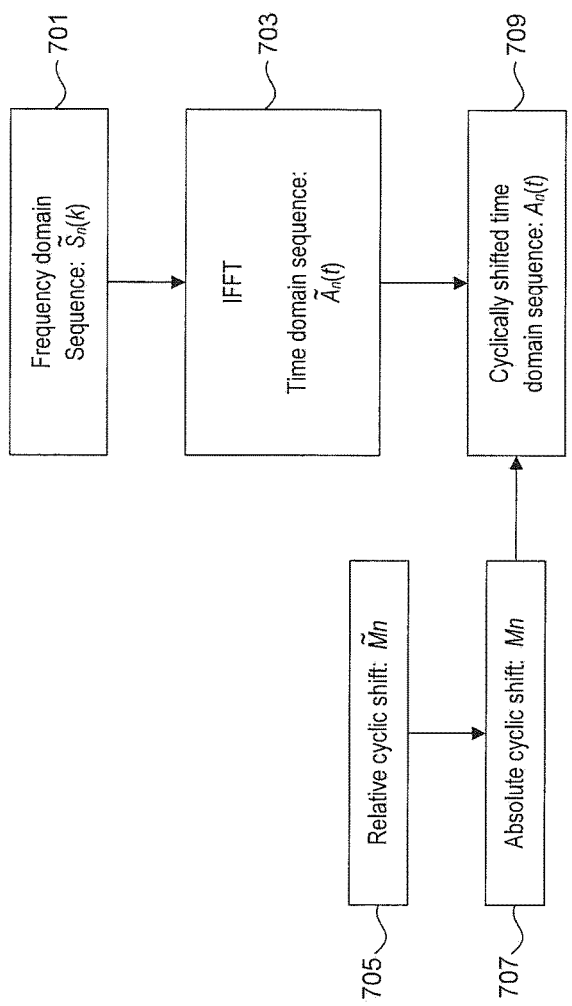
FIG. 7 is a flowchart depicting a method, according to an embodiment of the present disclosure.

The operations discussed above to generate a shifted time domain sequence $A_n(t)$ is summarized in FIG. 7. FIG. 7 is a flowchart depicting a method 700, according to an embodiment of the present disclosure. For example, method 700 can generate shifted time domain sequence $A_n(t)$ used to generate the n-th symbol of a bootstrap signal and/or of a band segmented bootstrap signal. In one example, method 700 is performed by systems 100, 200, and/or 250. It is to be appreciated not all steps may be needed, and the steps may not be performed in the same order as shown in FIG. 7. Reference is made to systems 200 and 250 merely for convenience of discussion. Other systems may be used to perform the method as will be understood by those skilled in the arts.

In 701, mapping module 219 generates the frequency domain signal $\tilde{s}_n(k)$ as discussed above. In 703, the frequency domain signal $\tilde{s}_n(k)$ is translated to a time domain sequence $\tilde{A}_n(t)$ using, for example, IFFT module 221. In 705, cyclic shift module 217 generates a relative cyclic shift $\tilde{M}_n$ using the signaling bits as an input. In 707, cyclic shift module 217 generates an absolute cyclic shift $M_n$ by summing the absolute cyclic shift for symbol n−1 and the relative cyclic shift for symbol n, modulo the length of the time domain sequence. In 709, the absolute cyclic shift is applied to the time domain sequence $\tilde{A}_n(t)$ to obtain the shifted time domain sequence $A_n(t)$.

Although FIG. 7 illustrates an embodiment that the cyclic shift is applied in the time domain, the cyclic shift can also be applied in the frequency domain, as discussed above.

Figure 8A:
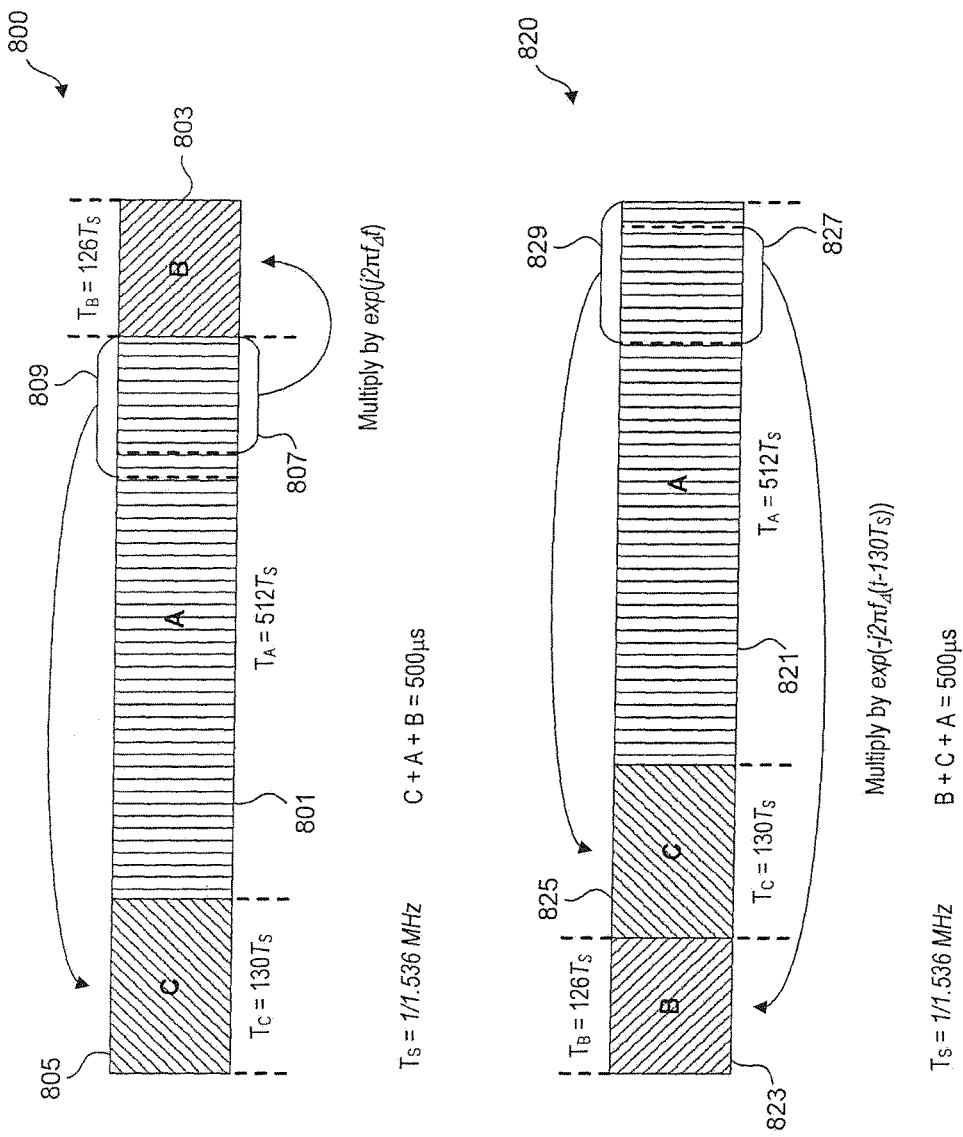
FIGS. 8A-8B illustrate exemplary time domain data structures of received signals at a band segmented bootstrap receiver, according to some embodiments of the present disclosure.
Figure 8B:
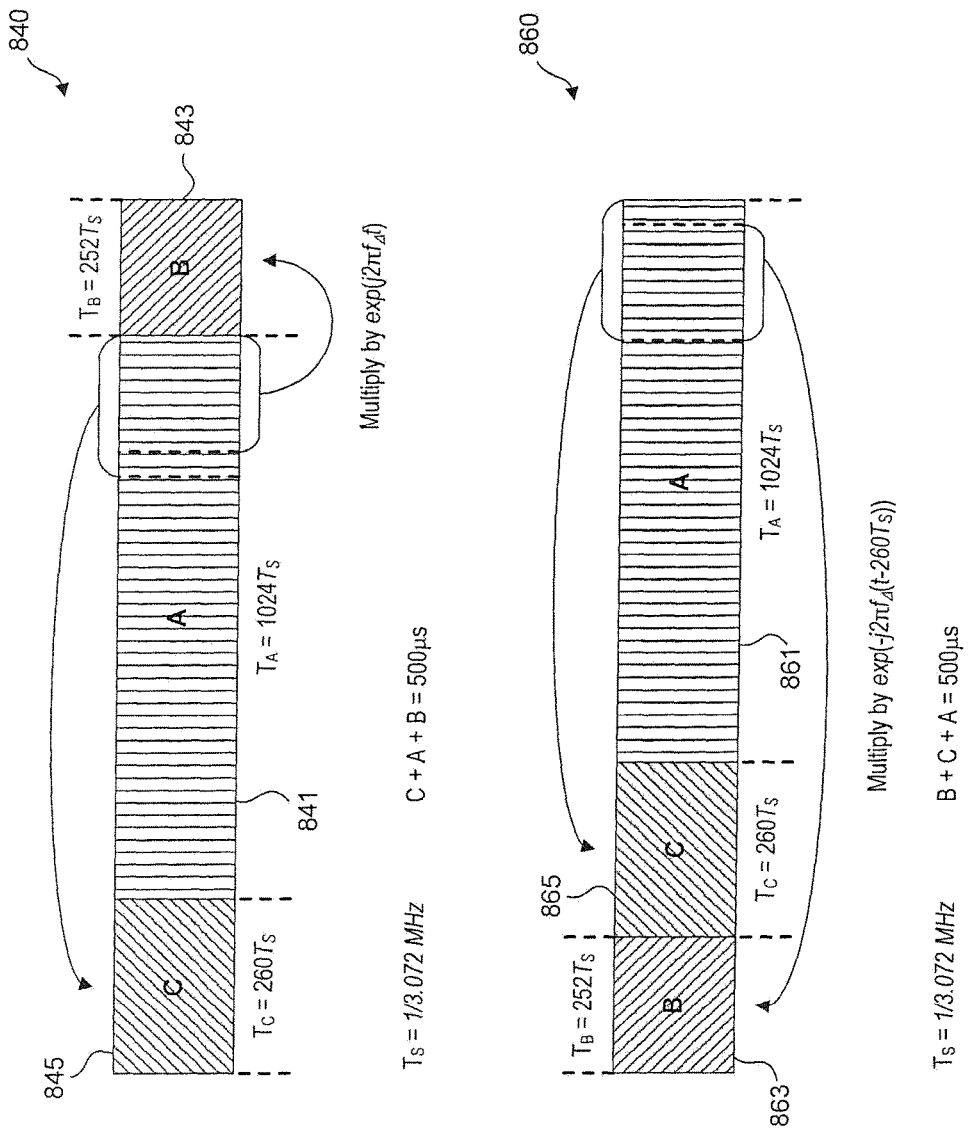

Each one of FIGS. 8A and 8B illustrates two time domain structures (CAB, BCA) of a received symbol of a band segmented bootstrap signal output 223 (CAB, BCA) previously discussed and is now presented with respect to the receiver and its sampling rate $F_S$ and FFT size so indicated, according to some embodiments of this disclosure. The transmitter's sampling rate $F_S$ can be 4 times larger (than the sampling rate of the receiver) and the FFT size of the IFFT module of the transmitter can be 4 times larger (than the FFT size of the receiver) for FIG. 8A with a common frequency spacing of ΔF=3000 Hz. The transmitter's sampling rate $F_S$ can 2 times larger (than the sampling rate of the receiver) and the FFT size of the IFFT module of the transmitter can be 2 times larger (than the FFT size of the receiver) for FIG. 8B with a common subcarrier spacing of ΔF=3000 Hz, according to some embodiments of this disclosure.

Each of the embodiments of FIGS. 8A and 8B, shows the band segmented bootstrap symbols from perspective of receiver which can use reduced $F_S$ and FFT size as indicated to save power when receiving. Each symbol is composed of three parts: A, B, and C created by module 223, where each of these parts consists of a sequence of complex-valued time domain samples. Part A is derived from IFFT module 221 as the IFFT of the frequency domain structure with an appropriate cyclic shift applied, while parts B and C are composed of samples taken from part A with a frequency shift of $\pm f_A$ (equal to the subcarrier spacing) and a possible phase shift of $e^{-\pi}$ introduced to the frequency domain sequences for calculating the samples of part B.

In one embodiment, a time domain structure includes two variants: CAB and BCA. The initial symbol of the band segmented bootstrap signal (i.e., symbol #0), provided for sync detection, can employ the CAB variant. The remaining symbols of the band segmented bootstrap signal (i.e., symbol n where $1 \le n < N_s$) can conform to the BCA variant carrying signaling data up to and including the bootstrap symbol that indicates field termination.

It should be appreciated that having both variants CAB and BCA allows for correlation at receiver and improved initial synchronization (finding CAB) and discovery since the receiver knows to expect this repetition in a particular order and have correlators or detectors so designed that makes the signal easier to discover and lock onto, even in high noise conditions.

According to one embodiment, a receiver device, such as receiver device 1100, can be configured to search to detect CAB structure 800 of FIG. 8A. CAB structure 800 can be used for a symbol of a band segmented bootstrap signal such as band segmented bootstrap signal 411 of FIG. 4A and is based on the time domain signal $A_n(t)$ for the n-th symbol. In this example, part A 801 includes received $N_A$=512 samples. Part C 805 includes the last $N_C$=130 samples 809 of part A 801. Part B 803 includes the last $N_B$=126 samples 807 of part A 801 with a frequency shift of $+f_A$ and a phase shift of $e^{-j\pi}$ applied to the originating frequency domain sequence $\tilde{S}_n(k)$ used for calculating part A 801. The receiver will search for this CAB structure using correlators or detectors to locate and synchronize to symbol #0 and extract and process Part A 801 to discover major, minor version, etc. to start the bootstrap process.

In this example of FIG. 8A, receiver sampling period $T_S=1/f_S=1/1.536$ MHz and FFT size is 512 which both are ¼ that of the transmitter of FIG. 2C allowing power savings and narrow band reception. Also, the length of the CAB structure 800 of the symbol of the band segmented bootstrap is 500 μs is same as transmitter with ΔF=3000 Hz.

According to this example, a receiver device, such as receiver device 1100 can be configured to detect BCA time domain structure 820 of FIG. 8A. BCA structure 820 has a Part A which has signaling information being conveyed by cyclic shifts as previously discussed and can be used for a symbol of a band segmented bootstrap signal such as band segmented bootstrap signal 411 of FIG. 4A-C and is based on the time domain signal $A_n(t)$ for the n-th symbol. In this example, part A 821 includes $N_A$=512 samples. Part C 825 includes (e.g., is generated as) the last $N_C$=130 samples 829 of part A 821. Part B 823 includes (e.g., is generated as) the $N_B$=126 samples 827 of part A 821 with a frequency shift of $-f_A$ applied to the originating frequency domain sequences $\tilde{S}_n(k)$ used for calculating part A 821.

In this example of FIG. 8A, receiver sampling period $T_S=1/f_S=1/1.536$ MHz, FFT size 512. Also, the length of the BCA structure 820 of the symbol of the band segmented bootstrap is 500 μs is same as transmitter with ΔF=3000 Hz. Once BCA structure is detected Part A is used to detect auto-correlation which has cyclic shifts to convey signaling information as previously discussed.

According to another embodiment, a receiver device, such as receiver device 1100 can be configured to detect CAB structure 840 of FIG. 8B. Structure 840 can be used for a symbol of a band segmented bootstrap signal such as band segmented bootstrap signal 411C of FIG. 4C and is based on the time domain signal $A_n(t)$ for the n-th symbol.

According to some embodiments, received CAB structure 840 is similar to CAB structure 800 of FIG. 8A and detection using correlation techniques are used. However, the length of part A 841, part B 843, and part C 845 of CAB structure 840 are different than the respective parts of CAB structure 800 of FIG. 8A. For example, part A 841 of received CAB structure 840 has 1024 samples, part B 843 of structure 840 has 252 samples, and part C 845 of CAB structure 840 has 260 samples. Additionally, the receiver sampling frequency (and therefore, the sampling period) for CAB structure 840 is different than the receiver sampling frequency for CAB structure 800 of FIG. 8A. The receiver will search for this CAB structure using correlators or detectors to locate and synchronize to symbol #0 and extract and process Part A to discover major, minor version, etc. to start the bootstrap process. For example, receiver sampling period $T_S=1/f_S=1/3.072$ MHz for CAB structure and FFT 1024 both ½ that of transmitter previously discussed and allowing power savings and narrow band reception of 840. The length of the CAB structure 840 of the symbol of the band segmented bootstrap is 500 μs is same as transmitter with ΔF=3000 Hz.

According to some embodiments, received BCA structure 860 is similar to BCA structure 820 of FIG. 8A. However, the length of part A 861, part B 863, and part C 865 of BCA structure 860 are different than the respective parts of BCA structure 820 of FIG. 8A. For example, part A 861 of received BCA structure 860 has 1024 samples, part B 863 of structure 860 has 252 samples, and part C 865 of BCA structure 860 has 260 samples. Once BCA structure is detected Part A is used to detect auto-correlation which has cyclic shifts to convey signaling information as previously discussed. Additionally, the sampling frequency (and therefore, the sampling period) for BCA structure 860 is different than the sampling frequency for BCA structure 820 of FIG. 8A. For example, receiver sampling period $T_S=1/f_S=1/3.072$ MHz and FFT 1024 both ½ that of transmitter previously discussed and allowing power savings and narrow band reception for BCA structure 860. The length of the BCA structure 860 of the symbol of the band segmented bootstrap is 500 μs μs is same as transmitter with ΔF=3000 Hz.

FIGS. 9A-9E illustrates signals including both a band segmented bootstrap signal and a partitioned post bootstrap signal before the signals are translated to time domain for transmission, according to some embodiments of this disclosure.

Figure 9A:
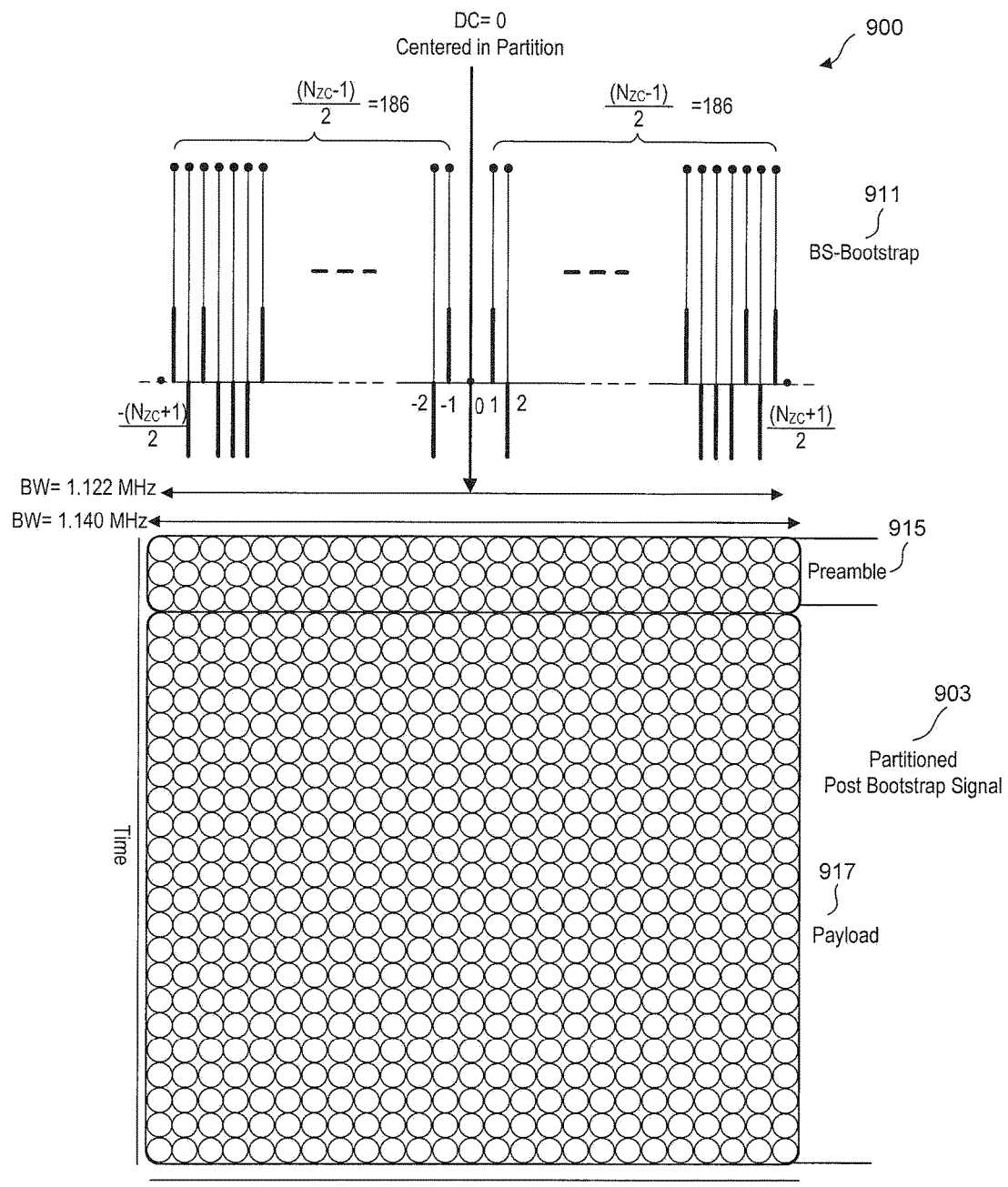
FIGS. 9A-9E illustrates signals including a band segmented bootstrap signal and a segment of a partitioned post bootstrap signal before the signals are translated to time domain, according to some embodiments of the present disclosure.

FIG. 9A illustrates signal 900 before the signal is translated to time domain. Signal 900 includes a band segmented bootstrap signal 911 and a partitioned post bootstrap signal 903. Partitioned post bootstrap signal 903 can include a preamble 915 and a payload 917. Band segmented bootstrap signal 911 and partitioned post bootstrap signal 903 of signal 900 are similar to band segmented bootstrap signals 411A-E and partitioned post bootstrap signal 403 made up of portions 415 A-E and portions 417 A-E of FIG. 4B. In this example of signal 900, the bandwidth is 1.122 MHz for band segmented bootstrap signal 911 and 1.14 MHz for partitioned post bootstrap signal 903 made up of preamble 915 and payload 917. As discussed above, the DC can be centered in band segmented bootstrap signal 911 and band segmented bootstrap signal 911 can be aligned with partitioned post bootstrap signal 903 to create a narrow band channel for reception. In this example, post bootstrap signal 903 does not have any pilots.

Figure 9B:
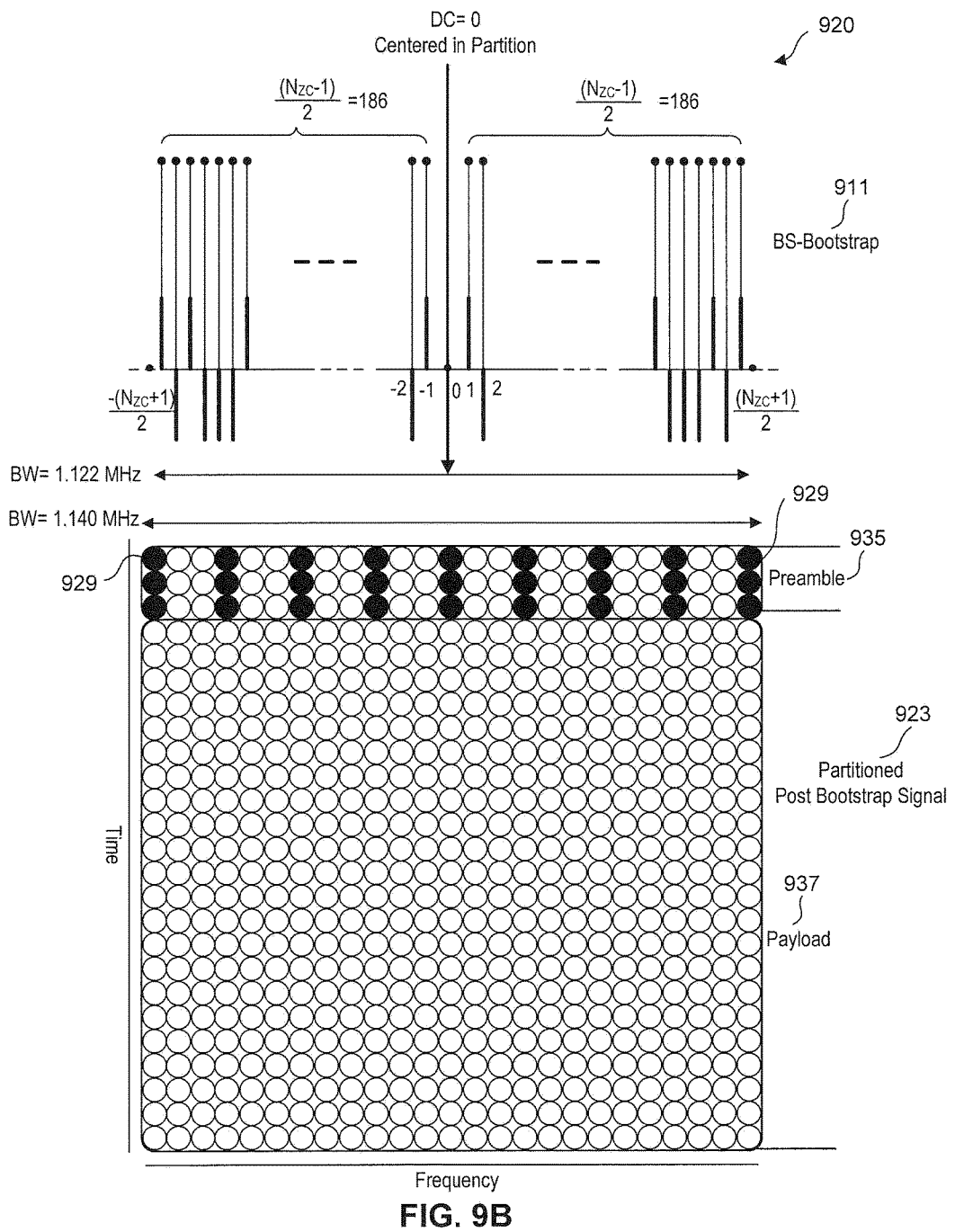

FIG. 9B illustrates signal 920 before the signal is translated to time domain. Signal 920 includes a band segmented bootstrap signal 911 and a partitioned post bootstrap signal 923. Partitioned post bootstrap signal 923 can include a preamble 935 and a payload 937. Band segmented bootstrap signal 911 and partitioned post bootstrap signal 923 of signal 920 are similar to band segmented bootstrap signals 411A-E and partitioned post bootstrap signal 403 made up of portions 415 A-E and portions 417 A-E of FIG. 4B. In this example, the bandwidth is 1.122 MHz for band segmented bootstrap signal 911 and 1.14 MHz for partitioned post bootstrap signal 923 and 1.14 MHz for partitioned post bootstrap signal 923. As discussed above, the DC is centered in band segmented bootstrap signal 911 and band segmented bootstrap signal 911 can be aligned with partitioned post bootstrap signal 923. In this example, preamble 935 of partitioned post bootstrap signal 923 can include preamble pilots 929. According to one embodiment, preamble pilots 929 can have a dense pilot pattern. Preamble pilots 929 can be used by a receiver to support accurate channel estimation and decoding of control signaling carried in preamble.

Figure 9C:
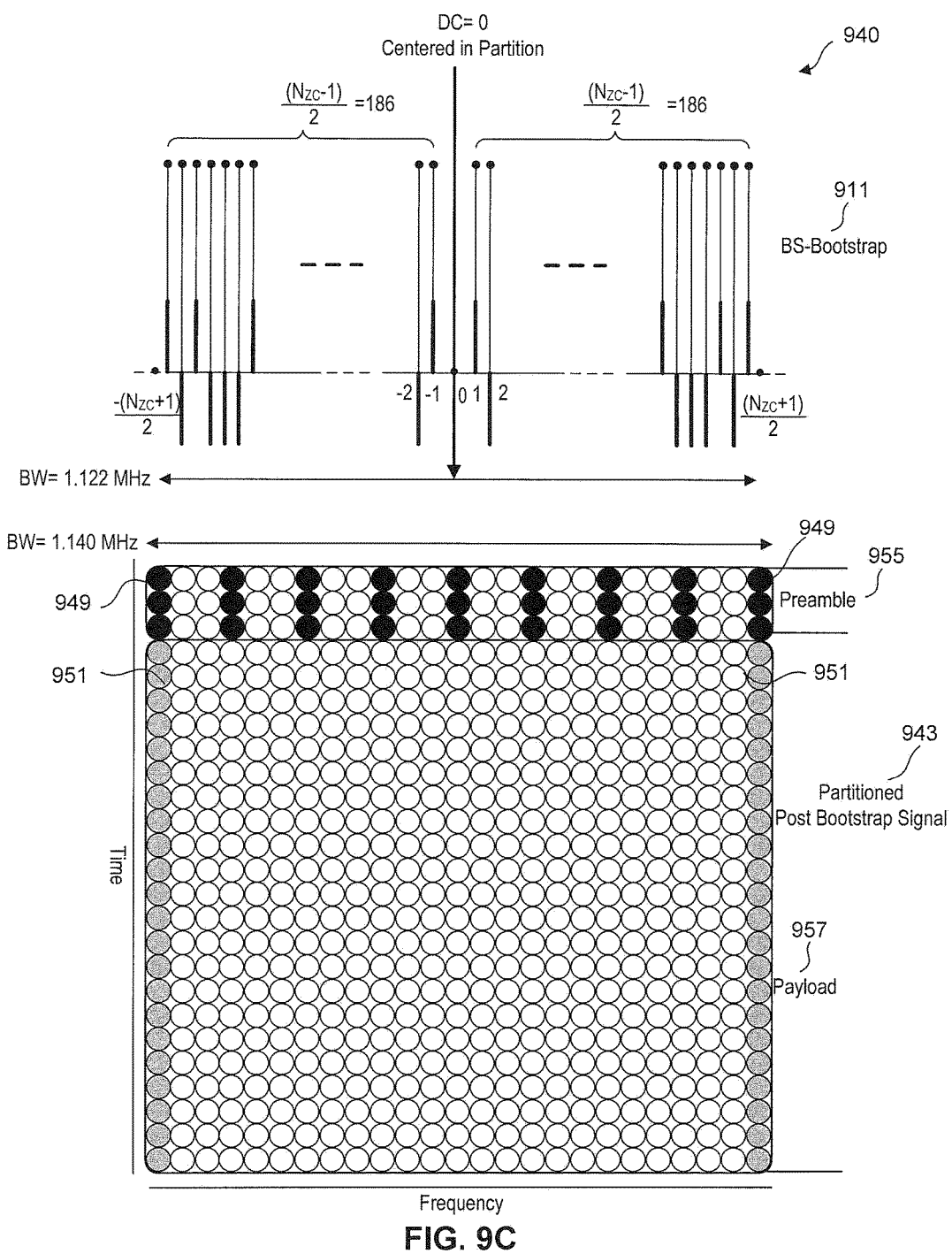

FIG. 9C illustrates signal 940 before the signal is translated to time domain. Signal 940 includes a band segmented bootstrap signal 911 and a partitioned post bootstrap signal 943. Partitioned post bootstrap signal 943 can include a preamble 955 and a payload 957. Band segmented bootstrap signal 911 and partitioned post bootstrap signal 943 of signal 940 are similar to band segmented bootstrap signals 411A-E and partitioned post bootstrap signal 403 made up of portions 415 A-E and portions 417 A-E of FIG. 4B. In this example, the bandwidth is 1.122 MHz for band segmented bootstrap signal 911 and 1.14 MHz for partitioned post bootstrap signal 943. As discussed above, the DC is centered in band segmented bootstrap signal 911 and band segmented bootstrap signal 911 can be aligned with partitioned post bootstrap signal 943. In this example, preamble 955 of partitioned post bootstrap signal 943 can include preamble pilots 949. Additionally, payload 957 of partitioned post bootstrap signal 943 can include edge pilots 951 located at the boundary of payload partition. Edge pilots 951 can assist with channel estimation and/or frequency tracking at a receiver. For example, edge pilots 951 can allow channel estimation up to channel partition edges.

Figure 9D:
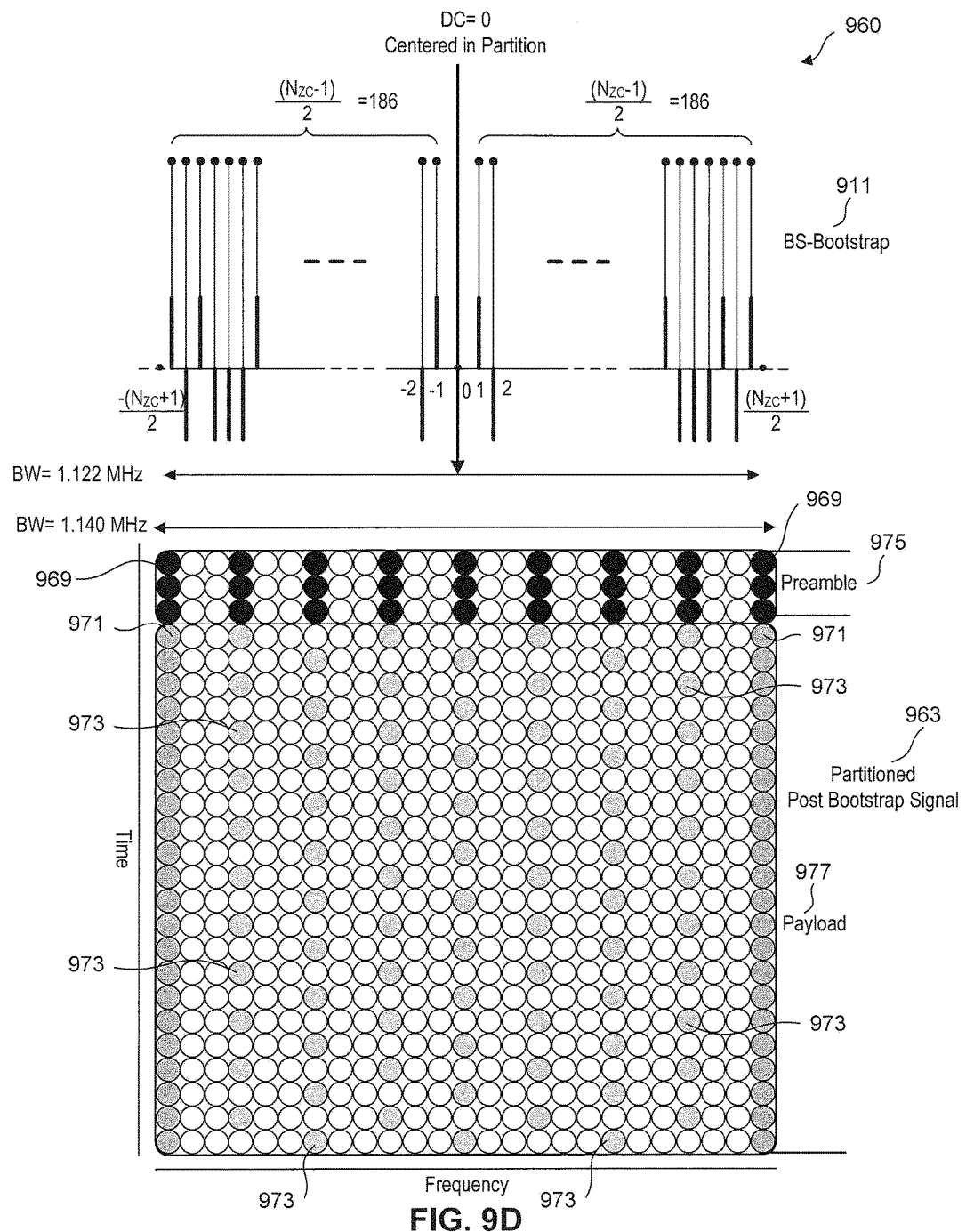

FIG. 9D illustrates signal 960 before the signal is translated to time domain. Signal 960 includes a band segmented bootstrap signal 911 and a partitioned post bootstrap signal 963. Partitioned post bootstrap signal 963 can include a preamble 975 and a payload 977. Band segmented bootstrap signal 911 and partitioned post bootstrap signal 963 of signal 960 are similar to band segmented bootstrap signals 411A-E and partitioned post bootstrap signal 403 made up of portions 415 A-E and portions 417 A-E of FIG. 4B. In this example, the bandwidth is 1.122 MHz for band segmented bootstrap signal 911 and 1.14 MHz for partitioned post bootstrap signal 963. As discussed above, the DC is centered in band segmented bootstrap signal 911 and band segmented bootstrap signal 911 can be aligned with partitioned post bootstrap signal 963. In this example, preamble 975 of partitioned post bootstrap signal 963 can include preamble pilots 969. Additionally, payload 977 of partitioned post bootstrap signal 963 can include edge pilots 971 located at the boundary of payload partition. Additionally, payload 977 of partitioned post bootstrap signal 963 can include scattered pilots 973. Scattered pilots 973 can also assist with channel estimation and/or frequency tracking at a receiver.

Figure 9E:
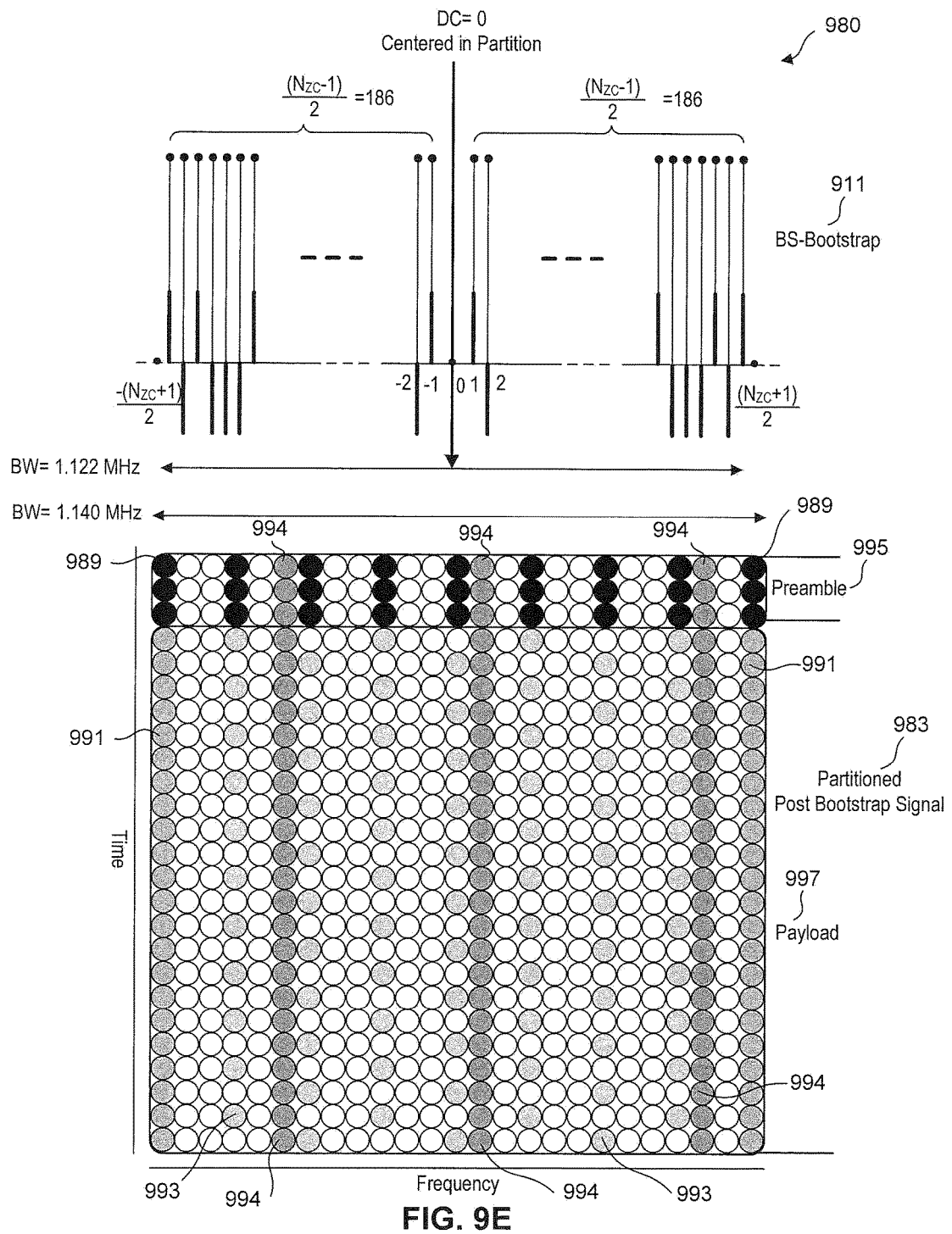

FIG. 9E illustrates signal 980 before the signal is translated to time domain. Signal 980 includes a band segmented bootstrap signal 911 and a partitioned post bootstrap signal 983. Partitioned post bootstrap signal 983 can include a preamble 995 and a payload 997. Band segmented bootstrap signal 911 and partitioned post bootstrap signal 983 of signal 980 are similar to band segmented bootstrap signal 411A-E and partitioned post bootstrap signal 403 made up of portions 415 A-E and portions 417 A-E of FIG. 4B. In this example, the bandwidth is 1.122 MHz for band segmented bootstrap signal 911 and 1.14 MHz for partitioned post bootstrap signal 983. As discussed above, the DC is centered in band segmented bootstrap signal 911 and band segmented bootstrap signal 911 can be aligned with partitioned post bootstrap signal 983. In this example, preamble 995 of partitioned post bootstrap signal 983 can include preamble pilots 989. Additionally, payload 997 of partitioned post bootstrap signal 983 can include edge pilots 991 located at the boundary of payload partition. Additionally, payload 997 of partitioned post bootstrap signal 983 can include scattered pilots 993. In addition, preamble 995 and payload 997 of partitioned post bootstrap signal 983 can include continual pilots 994. Continual pilots 994 can be present in the same frequency location at preamble 995 and payload 997. Continual pilots 994 can enable frequency tracking at the receiver.

Figure 10:
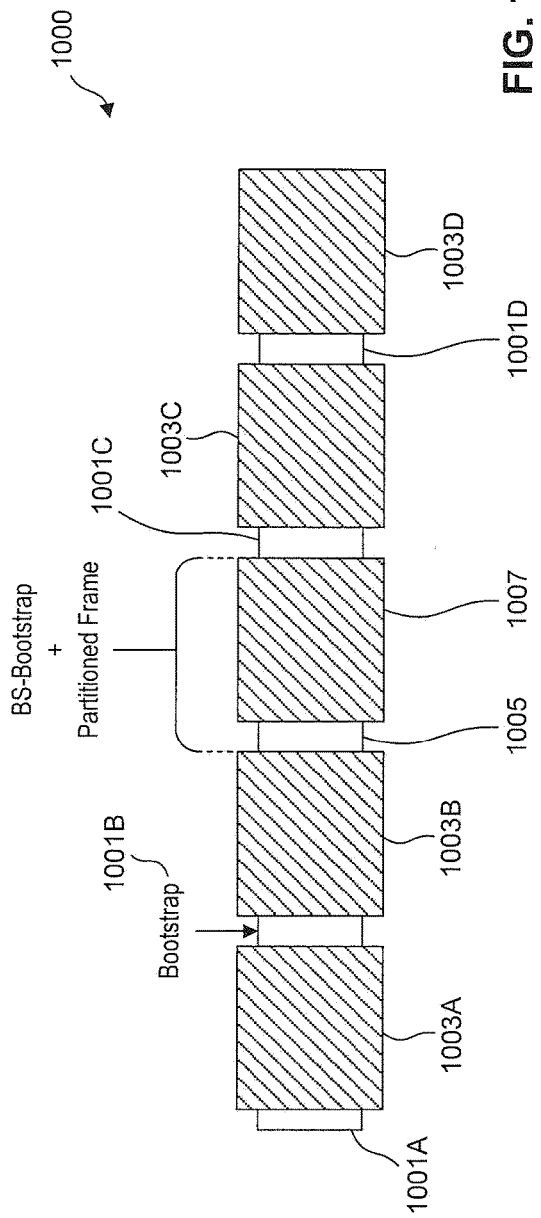
FIG. 10 illustrates a signal including a plurality of data frames, according to some embodiments of the present disclosure.

FIG. 10 illustrates a signal including a plurality of data frames, according to some embodiments of present disclosure. According to some embodiments, signal 1000 can be transmitted using a transmitter such as broadcast network 106 and/or gateway 108 of FIG. 1 to one or more receivers.

Signal 1000 can include one or more data frames. For example, signal 1000 can include bootstrap signals 1001A-1001D and one or more corresponding post bootstrap signals 1003A-1003D. Additionally, signal 1000 can include one or more band segmented bootstrap signals 1005 and one or more corresponding partitioned post bootstrap signals 1007. According to some embodiments, band segmented bootstrap signal 1005 and partitioned post bootstrap signal 1007 have the structure and the design discussed according to the embodiments of this disclosure. As illustrated in FIG. 10, one or more bootstrap signals 1001A-1001D and one or more corresponding post bootstrap signals 1003A-1003D can be multiplexed with one or more band segmented bootstrap signals 1005 and corresponding one or more partitioned post bootstrap signals 1007 using, for example, time division multiplexing. Accordingly, signal 1000 can be sent to different receivers using different applications, using different power levels, using different bandwidth, etc.

By using one or more bootstrap signals 1001A-1001D and one or more corresponding post bootstrap signals 1003A-1003D and/or one or more band segmented bootstrap signals 1005 and one or more corresponding partitioned post bootstrap signals 1007, system 100 of FIG. 1 can support new business models, new applications, and service evolutions. The ATSC 3.0 standard can represent bootstrap signals 1001A-1001D and post bootstrap signals 1003A-1003D and these data frames can be multiplexed with band segmented bootstrap 1005 and partitioned post bootstrap signal 1007 to introduce new receiver devices and services and new business models.

According to some embodiments, one or more receiver devices (such as receivers 112 of FIG. 1) are configured to receive signal 1000. Depending on which data frame is addressed to the receiver device, the receiver device is configured to decode the data addressed to it. For example, a first receiver device can be configured to receive bootstrap signal 1001B and the corresponding post bootstrap signal 1003B, use the information in bootstrap signal 1001B to synchronize and decode the corresponding post bootstrap signal 1003B.

Additionally or alternatively, a second receiver device is configured to tune to and receive a first segment of the band segmented bootstrap signal 1005. This second receiver can use the information within the received segment of the band segmented bootstrap signal 1005 to synchronize with and decode the data in the corresponding segment of partitioned post bootstrap signal 1007. In this example, a third receiver device can be configured to tune to and receive a second segment of the band segmented bootstrap signal 1005. This third receiver can use the information within the received second segment of the band segmented bootstrap signal 1005 to synchronize with and decode the data in the corresponding segment of partitioned post bootstrap signal 1007. By using band segmented bootstrap signals and partitioned post bootstrap signals, receiver devices can have lower complexity circuits/modules. For example, using band segmented bootstrap signals and partitioned post bootstrap signals can results in lower bandwidth, lower sampling, smaller FFT size, and/or lower power consumption at the receiver device.

Figure 11:
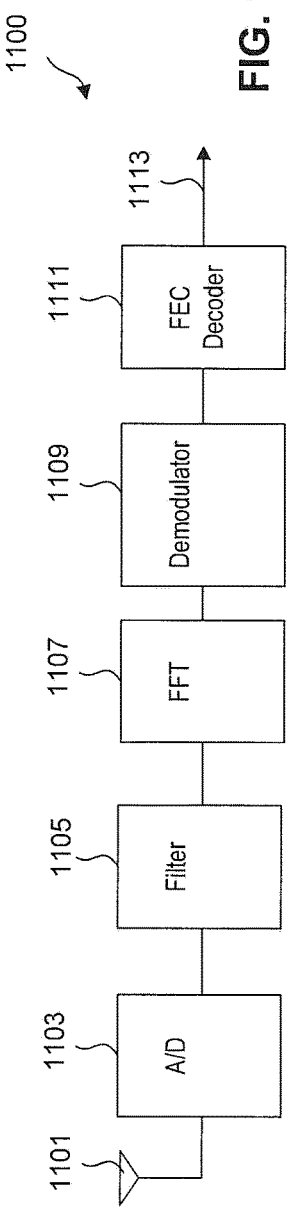
FIG. 11 illustrates an exemplary receiver device, according to an embodiment of the present disclosure.

FIG. 11 illustrates an exemplary receiver device, according to an embodiment of this disclosure. Receiver device 1100 of FIG. 11 can be used as receivers 112 or part of receivers 112. Circuits and modules illustrated in FIG. 11 are exemplary circuits and modules and receiver device 1100 can include other circuits.

According to one embodiment, receiver device 1100 can include, but is not limited to the following: a mobile phone, smartphone, personal digital assistant (PDA), navigation device, portable computer, Internet of Things (IoT), wearable devices, sensors networks, etc.

According to one embodiment, receiver device 1100 can include an antenna 1101 configured to receive a signal. In one embodiment, the signal received by antenna 1101 of the receiver device 1100 can include signal 1000 of FIG. 10. For example, the signal received by antenna 1101 of the receiver device 1100 can include one or more bootstrap signals and one or more corresponding post bootstrap signals, and/or one or more band segmented bootstrap signals and one or more corresponding partitioned post bootstrap signals. Receiver device 1100 can include an analog to digital convertor 1103 to convert the received signal from analog to digital. Although not shown, receiver device 1100 can include other circuits and/or modules between antenna 1101 and analog to digital convertor 1103, such as, but not limited to a radio frequency (RF) front end.

Receiver device 1100 can further include a filter 1105. Filter 1105 receives the digital signal and passes through a predetermined frequency range of the digital signal. For example, filter 1105 can include a band pass filter. According to some embodiments, the parameters of filter 1105 can depend on the channel to which receiver device 1100 is tuned. Accordingly, receiver device 1100 can be configured to filter out the segments of the band segmented bootstrap signal and partitioned post bootstrap signal that are not sent for receiver device 1100. In other words, receiver device 1100 can be configured to pass through the segment of the band segmented bootstrap signal and partitioned post bootstrap signal that is meant for receiver device 1100. Using the segment of the band segmented bootstrap signal meant for receiver device 1100, receiver device 1100 can be configured to synchronize, receive corresponding partitioned post bootstrap signal, and decode the received corresponding partitioned post bootstrap signal.

According to one embodiment, receiver device 1100 can include an FFT module 1107 configured to receive the filtered signal. Using FFT module 1107, receiver device 1100 can translate the filtered signal from time domain to frequency domain. Because of using a band segmented bootstrap signal (and corresponding partitioned post bootstrap signal), receiver device 1100 can include the FFT module 1107 with smaller FFT size. Using band segmented bootstrap signals and partitioned post bootstrap signals can result in receiver device 1100 using lower bandwidth, lower sampling, smaller FFT size, and/or lower power consumption.

According to some embodiments, in order to receive and decode the segment of the band segmented bootstrap signal destined for receiver 1100, FFT module 1107 can use an FFT size of 512 and receiver 1100 can operate with sampling rate of 1.536 MHz and a frequency spacing of 3 kHz. In some embodiments, FFT module 1107 can use an FFT size of 1024 and receiver 1100 can operate with sampling rate of 3.072 MHz and a frequency spacing of 3 kHz. In some embodiments, FFT module 1107 can use an FFT size of 2048 and receiver 1100 can operate with sampling rate of 6.144 MHz and a frequency spacing of 3 kHz.

According to some embodiments, in order to receive and decode the segment of the partitioned post bootstrap signal corresponding to the segment of the band segmented bootstrap signal destined for receiver 1100, FFT module 1107 can use an FFT size of 2048 and receiver 1100 can operate with sampling rate of 1.728 MHz and a frequency spacing of 843.75 Hz.

Receiver device 1100 can further include a demodulator circuit/module 1109. Demodulator 1109 can receive the frequency domain sequence from FFT module 1107 and recover the data from the modulated signal. The demodulated signal can pass through an FEC decoder 1111 to generate output signal 1113.

Figures 12A, 12B:
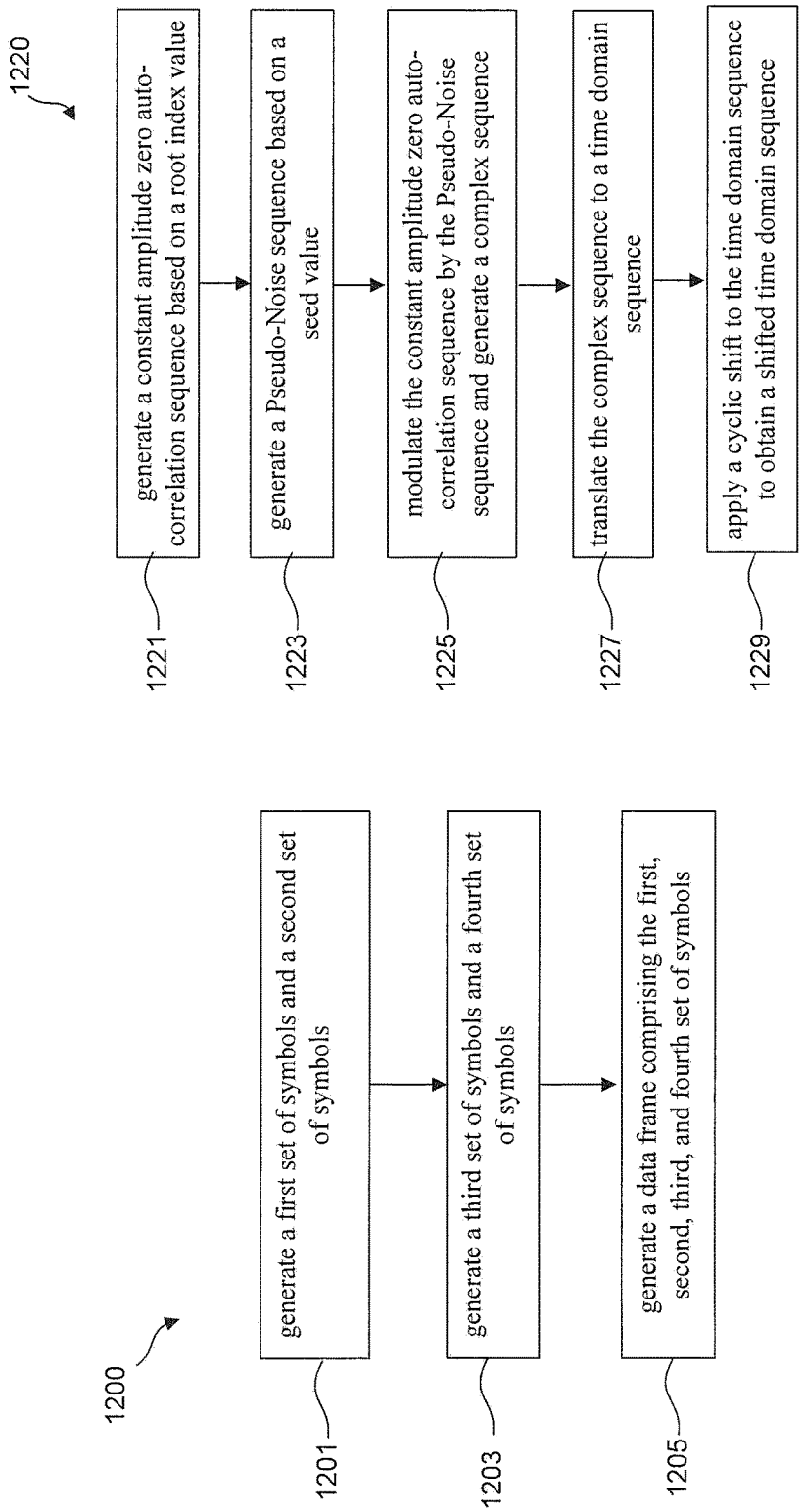
FIGS. 12A-12C are flowcharts depicting methods, according to some embodiments of the present disclosure.

FIG. 12A is a flowchart depicting a method 1200, according to an embodiment of the present disclosure. For example, method 1200 can generate one or more band segmented bootstrap signal and one or more corresponding portioned post bootstrap signals, according to some embodiments. In one embodiment, method 1200 is performed by systems 100, 200, and/or 260. It is to be appreciated not all steps may be needed, and the steps may not be performed in the same order as shown in FIG. 12A. Reference is made to systems 250 and 260 in FIGS. 2C and 2D merely for convenience of discussion. Other systems may be used to perform the method as will be understood by those skilled in the arts.

In 1201, one branch of system 250, for example branch 243a of system 250, generates a first set of symbols. The first set of symbols can include a first segment of a band segmented signal. In this step 1201, for example, one branch of system 260 of FIG. 2D, generates a second set of symbols. The second set of symbols can include a first segment of partitioned post bootstrap signal corresponding to the first segment of the band segmented signal. According to one embodiment, each symbol in the first set of symbols includes a first plurality of subcarriers and each symbol in the second set of symbols includes a second plurality of subcarriers, where the first plurality of subcarriers can be a subset of the second plurality of subcarriers. Also, the first set of symbols includes information about the second set of symbols. The first set of symbols can facilitate initial synchronization and decoding at a receiver.

In 1203, one branch of system 250, for example branch 243b of system 250, generates a third set of symbols. The third set of symbols can include a second segment of the band segmented signal. In this step 1203, for example, one branch of system 260 of FIG. 2D, generates a fourth set of symbols. The fourth set of symbols can include a second segment of the partitioned post bootstrap signal corresponding to the second segment of the band segmented signal. According to one embodiment, each symbol in the third set of symbols includes a third plurality of subcarriers and each symbol in the fourth set of symbols includes a fourth plurality of subcarriers, where the third plurality of subcarriers can be a subset of the fourth plurality of subcarriers. Also, the third set of symbols includes information about the fourth set of symbols. According to some embodiments, the first plurality of subcarriers are different than the third plurality of subcarriers and the second plurality of subcarriers are different than the fourth plurality of subcarriers. The third set of symbols can facilitate initial synchronization and decoding at a receiver.

In 1205, systems 250 and 260 (e.g., using mapping module 219 and IFFT module 221 and/or IFFT 273) generate a data frame that includes the first, second, third, and fourth set of symbols. For example, system 250 is configured to combine the first and third sets of symbols (the first and second segments of the band segmented bootstrap signal) to generate the band segmented bootstrap signal. For example, system 260 is configured to combine the second and fourth sets of symbols (the first and second segments of the partitioned post bootstrap signal) to generate the partitioned post bootstrap signal.

According to some embodiments, the generated data frame includes the band segmented bootstrap signal and its corresponding partitioned post bootstrap signal. Also, the data frame has a bandwidth that can include a first segment including the first and/or second plurality of subcarriers and a second segment including the third and/or fourth plurality of subcarriers. As discussed above, the first plurality of subcarriers can be a subset of the second plurality of subcarriers. And the third plurality of subcarriers can be a subset of the fourth plurality of subcarriers.

FIG. 12B is a flowchart depicting a method 1220, according to an embodiment of the present disclosure. For example, method 1220 can generate one or more band segmented bootstrap signals, according to some embodiments. In one example, method 1220 is performed by systems 100, 200, and/or 250. It is to be appreciated not all steps may be needed, and the steps may not be performed in the same order as shown in FIG. 12B. Reference is made to systems 200 and 250 in FIGS. 2A and 2C merely for convenience of discussion. Other systems may be used to perform the method as will be understood by those skilled in the arts.

In 1221, ZC sequence generator 207 can generate a ZC sequence (e.g., a constant amplitude zero auto-correlation sequence) based on a root index value. According to some embodiments, the constant amplitude zero auto-correlation sequence can have a length of 751 or 373 samples. However, other length for the constant amplitude zero auto-correlation sequence can also be used. According to some embodiments, as discussed above, cyclic shift module 217 is configured to apply a cyclic shift to the constant amplitude zero auto-correlation sequence. Additionally or alternatively, the cyclic shift is applied in time domain at step 1229.

In 1223, PN sequence generator 205 can generate a Pseudo-Noise sequence based on a seed value. In 1225, modulator 209 can modulate the constant amplitude zero auto-correlation sequence (or a cyclic shifter version of the constant amplitude zero auto-correlation sequence) by the Pseudo-Noise sequence and generating a complex sequence. In 1227, IFFT module 221 can translate the complex sequence to a time domain sequence. According to some embodiments, IFFT module 221 can use an inverse Fast Fourier Transform (IFFT) having a length of 1024 or 512. However, other lengths for IFFT module 221 can also be used. In 1229, cyclic shift module 217 can apply a cyclic shift to the time domain sequence to obtain a shifted time domain sequence.

Figure 12C:
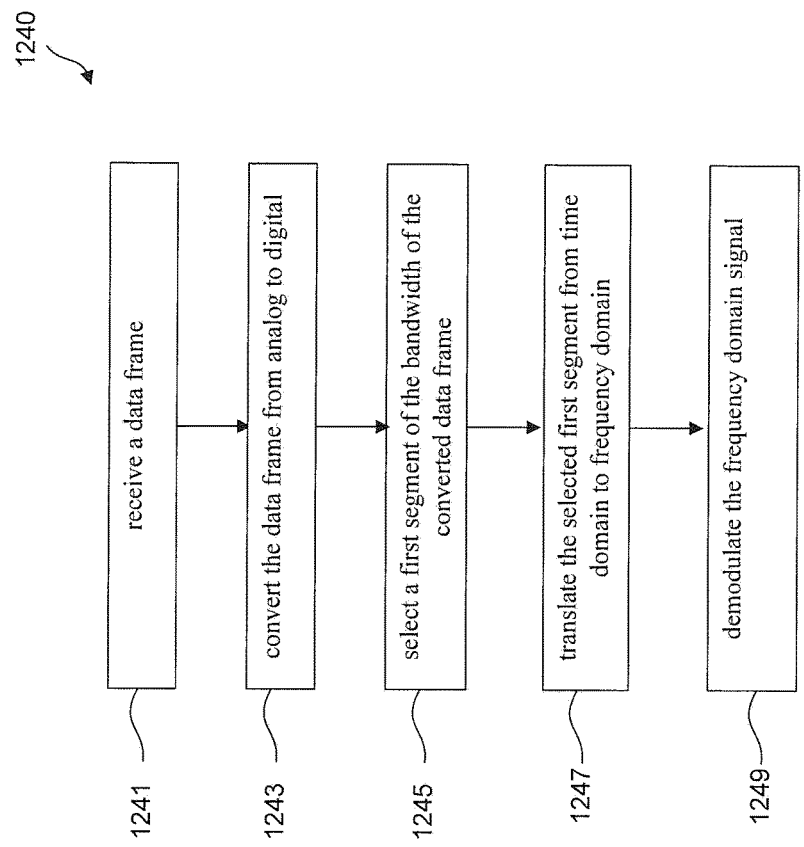

FIG. 12C is a flowchart depicting a method 1240, according to an embodiment of the present disclosure. For example, method 1240 can receive and decode one or more band segmented bootstrap signals and/or one or more partitioned post bootstrap signals, according to some embodiments. In one example, method 1240 is performed by receiver device 1100 of FIG. 11. It is to be appreciated not all steps may be needed, and the steps may not be performed in the same order as shown in FIG. 12C. Reference is made to receiver device 1100 in FIG. 11 merely for convenience of discussion. Other systems may be used to perform the method as will be understood by those skilled in the arts.

In 1241, receiver device 1100 receives, using for example antenna 1101, a data frame. According to one embodiment, the received data frame can include signal 1000 of FIG. 10. For example, the signal received by antenna 1101 of the receiver device 1100 can include the data frame generated by, for example, method 1200 of FIG. 12A. In other words, the signal received by antenna 1101 of the receiver device 1100 can include one or more bootstrap signals and one or more corresponding post bootstrap signals, and/or one or more band segmented bootstrap signals and one or more corresponding partitioned post bootstrap signals.

In 1243, receiver device 1100, using for example analog to digital convertor 1103, can convert the received data frame from analog to digital. In 1245, receiver device 1100, using for example, filter 1105, can select a first segment of the bandwidth of the converted data frame. In other words, filter 1105 can pass through a predetermined frequency range of the digital signal.

In 1247, receiver device 1100, using for example FFT module 1107, can translate the filtered signal (e.g., the selected first segment) from time domain to frequency domain. In 1249, receiver device 1100, using for example demodulator circuit/module 1109, can demodulate the frequency domain signal, recover the data from the modulated signal, and generate an output signal. Accordingly, the receiver device 1100 can decode one or more bootstrap signals and one or more corresponding post bootstrap signals and/or one or more band segmented bootstrap signals and one or more corresponding partitioned post bootstrap signals, according to some embodiments.

Figure 13:
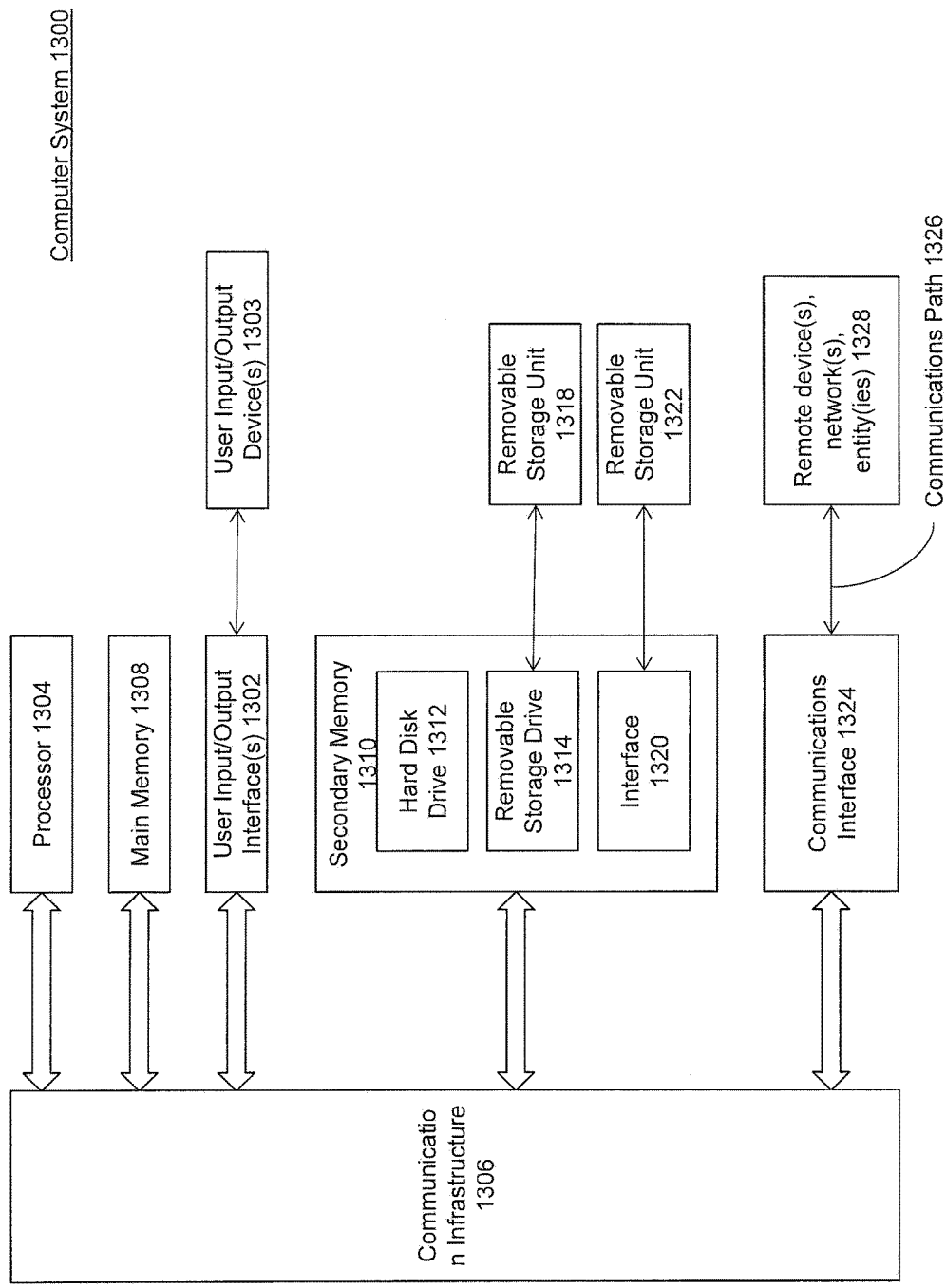
FIG. 13 illustrates a computer system that can be utilized to implement one or more embodiments of the present disclosure.

Various embodiments can be implemented, for example, using one or more computer systems, such as computer system 1300 shown in FIG. 13. Computer system 1300 can be used, for example, to implement method discussed in this disclosure such as, but not limited to, method 700 of FIG. 7, method 1200 of FIG. 12A, and/or method 1220 of FIG. 12B. For example, computer system 1300 can generate, transmit, receive, and/or decode one or more bootstrap signals and/or one or more corresponding post bootstrap signals and/or one or more band segmented bootstrap signals and one or more corresponding partitioned post bootstrap signals, according to some embodiments. For example, one or more of systems 100, 200, and/or 260 can be implemented using computer system 1300. In one example, gateway 108 and/or a transmitter in broadcast network 106 can be implemented using the computer system 1300. Computer system 1300 can be any computer capable of performing the functions described herein.

Computer system 1300 can be any well-known computer capable of performing the functions described herein.

Computer system 1300 includes one or more processors (also called central processing units, or CPUs), such as a processor 1304. Processor 1304 is connected to a communication infrastructure or bus 1306.

Computer system 1300 also includes user input/output device(s) 1303, such as monitors, keyboards, pointing devices, etc., that communicate with communication infrastructure 1306 through user input/output interface(s) 1302.

Computer system 1300 also includes a main or primary memory 1308, such as random access memory (RAM). Main memory 1308 can include one or more levels of cache. Main memory 1308 has stored therein control logic (i.e., computer software) and/or data.

Computer system 1300 can also include one or more secondary storage devices or memory 1310. Secondary memory 1310 can include, for example, a hard disk drive 1312 and/or a removable storage device or drive 1314. Removable storage drive 1314 can be a solid state memory, a floppy disk drive, a magnetic tape drive, a compact disk drive, an optical storage device, tape backup device, and/or any other storage device/drive.

Removable storage drive 1314 can interact with a removable storage unit 1318. Removable storage unit 1318 includes a computer usable or readable storage device having stored thereon computer software (control logic) and/or data. Removable storage unit 1318 can be a floppy disk, magnetic tape, compact disk, DVD, optical storage disk, and/or any other computer data storage device. Removable storage drive 1314 reads from and/or writes to removable storage unit 1318 in a well-known manner.

According to an exemplary embodiment, secondary memory 1310 can include other means, instrumentalities or other approaches for allowing computer programs and/or other instructions and/or data to be accessed by computer system 1300. Such means, instrumentalities or other approaches can include, for example, a removable storage unit 1322 and an interface 1320. Examples of the removable storage unit 1322 and the interface 1320 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1300 can further include a communication or network interface 1324. Communication interface 1324 enables computer system 1300 to communicate and interact with any combination of remote devices, remote networks, remote entities, etc. (individually and collectively referenced by reference number 1328). For example, communication interface 1324 can allow computer system 1300 to communicate with remote devices 1328 over communications path 1326, which can be wired and/or wireless, and which can include any combination of LANs, WANs, the Internet, etc. Control logic and/or data can be transmitted to and from computer system 1300 via communication path 1326.

In an embodiment, a tangible apparatus or article of manufacture comprising a tangible computer useable or readable medium having control logic (software) stored thereon is also referred to herein as a computer program product or program storage device. This includes, but is not limited to, computer system 1300, main memory 1308, secondary memory 1310, and removable storage units 1318 and 1322, as well as tangible articles of manufacture embodying any combination of the foregoing. Such control logic, when executed by one or more data processing devices (such as computer system 1300), causes such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 13. In particular, embodiments can operate with software, hardware, and/or operating system implementations other than those described herein.

The disclosure is also directed to computer program products comprising software stored on any computer useable medium. Such software, when executed in one or more data processing device, causes a data processing device(s) to operate as described herein. Embodiments of the disclosure employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus, the disclosure should not be limited by any of the above-described exemplary embodiments. Further, the claims should be defined only in accordance with the following claims and their equivalents.

What is claimed is:

1. A transmitter, comprising:
   a memory configured to store program instructions; and
   a processor, upon executing the program instructions, configured to:
   generate a first set of symbols and a second set of symbols, each symbol in the first set of symbols comprising a first plurality of subcarriers and each symbol in the second set of symbols comprising a second plurality of subcarriers, wherein the first set of symbols comprises information about the second set of symbols and the first plurality of subcarriers are a subset of the second plurality of subcarriers;
   generate a third set of symbols and a fourth set of symbols, each symbol in the third set of symbols comprising a third plurality of subcarriers and each symbol in the fourth set of symbols comprising a fourth plurality of subcarriers, wherein the third set of symbols comprises information about the fourth set of symbols, the third plurality of subcarriers are a subset of the fourth plurality of subcarriers, and wherein the third and fourth sets of symbols are configured to be received and decoded by a narrow band receiver independently from the first and second sets of symbols; and
   generate a data frame comprising the first, second, third, and fourth sets of symbols, wherein a bandwidth of the data frame comprises a first segment including the second plurality of subcarriers and a second segment including the fourth plurality of subcarriers.

2. The transmitter of claim 1, wherein a bandwidth of the first segment is equal to a bandwidth of the second segment.

3. The transmitter of claim 1, wherein a bandwidth of the first segment is different than a bandwidth of the second segment.

4. The transmitter of claim 1, wherein a bandwidth associated with the first set of symbols is selected from a group consisting of 1.122 MHz, 2.256 MHz, and 4.5 MHz.

5. The transmitter of claim 1, wherein to generate a symbol of the first set of symbols, the processor is configured to:
   generate a constant amplitude zero auto-correlation sequence based on a root index value;
   generate a Pseudo-Noise sequence based on a seed value;
   modulate the constant amplitude zero auto-correlation sequence by the Pseudo-Noise sequence to generate a complex sequence; and
   translate the complex sequence to a time domain sequence.

6. The transmitter of claim 5, wherein the constant amplitude zero auto-correlation sequence has a length of 751 or 373 samples.

7. The transmitter of claim 5, wherein the processor is configured to translate the complex sequence to the time domain sequence using an Inverse Fast Fourier Transform (IFFT).

8. The transmitter of claim 1, wherein the second set of symbols comprises one or more preamble pilot signals, edge pilot signals, scattered pilot signals, and continual pilot signals.

9. The transmitter of claim 1, wherein the processor is further configured to:
   generate a fifth set of symbols and a sixth set of symbols, each symbol in the fifth set of symbols comprising a fifth plurality of subcarriers and each symbol in the sixth set of symbols comprising a sixth plurality of subcarriers,
   wherein the fifth set of symbols comprises information about the sixth set of symbols,
   wherein the fifth plurality of subcarriers are a subset of the sixth plurality of subcarriers,
   wherein the data frame further comprises the fifth and sixth sets of symbols, and
   wherein the bandwidth of the data frame comprises a third segment including the sixth plurality of subcarriers.

10. The transmitter of claim 1, wherein the processor is further configured to:
    generate a second data frame; and
    time multiplex the data frame and the second data frame.

11. A receiver, comprising:
    an antenna configured to receive a data frame, the data frame comprising:
    a first set of symbols and a second set of symbols, each symbol in the first set of symbols comprising a first plurality of subcarriers and each symbol in the second set of symbols comprising a second plurality of subcarriers, wherein the first set of symbols comprises information about the second set of symbols and the first plurality of subcarriers are a subset of the second plurality of subcarriers; and
    a third set of symbols and a fourth set of symbols, each symbol in the third set of symbols comprising a third plurality of subcarriers and each symbol in the fourth set of symbols comprising a fourth plurality of subcarriers, wherein the third set of symbols comprises information about the fourth set of symbols and the third plurality of subcarriers are a subset of the fourth plurality of subcarriers,
    wherein a bandwidth of the data frame comprises a first segment including the second plurality of subcarriers and a second segment including the fourth plurality of subcarriers; and
    a filter configured to select the first segment of the bandwidth of the data frame that includes the first and the second sets of symbols,
    wherein the receiver is configured to decode the first and second sets of symbols independently from the third and fourth sets of symbols.

12. The receiver of claim 11, wherein a bandwidth associated with the first set of symbols is equal to a bandwidth associated with the third set of symbols, and is selected from a group consisting of 1.122 MHz, 2.256 MHz, and 4.5 MHz.

13. The receiver of claim 11, wherein a bandwidth associated with the first set of symbols is different from a bandwidth associated with the third set of symbols, and is selected from a group consisting of 1.122 MHz, 2.256 MHz, and 4.5 MHz.

14. The receiver of claim 11, wherein:
    the data frame further comprises a fifth set of symbols and a sixth set of symbols, each symbol in the sixth set of symbols comprising a fifth plurality of subcarriers,
    the fifth set of symbols comprises information about the sixth set of symbols, and
    the bandwidth of the data frame comprises a third segment including the fifth plurality of subcarriers.

15. The receiver of claim 11, further comprising:
    a Fast Fourier Transform (FFT) module configured to translate the selected first set of symbols from a time domain to a frequency domain, wherein the FFT module has a size of 1024 point or 512 point.

16. The receiver of claim 11, wherein the second set of symbols comprises one or more preamble pilot signals, edge pilot signals, scattered pilot signals, and continual pilot signals.

17. A system, comprising:
a transmitter configured to generate a data frame, the transmitter comprising:
a memory configured to store instructions; and
a processor, upon executing the instructions, configured to:
generate a first set of symbols and a second set of symbols, each symbol in the first set of symbols comprising a first plurality of subcarriers and each symbol in the second set of symbols comprising a second plurality of subcarriers, wherein the first set of symbols comprises information about the second set of symbols and the first plurality of subcarriers are a subset of the second plurality of subcarriers;
generate a third set of symbols and a fourth set of symbols, each symbol in the third set of symbols comprising a third plurality of subcarriers and each symbol in the fourth set of symbols comprising a fourth plurality of subcarriers, wherein the third set of symbols comprises information about the fourth set of symbols, wherein the third plurality of subcarriers are a subset of the fourth plurality of subcarriers, and wherein the third and fourth sets of symbols are configured to be received and decoded by a first narrow band receiver independently from the first and second sets of symbols; and
generate the data frame comprising the first, second, third, and fourth sets of symbols, wherein a bandwidth of the data frame comprises a first segment including the second plurality of subcarriers and a second segment including the fourth plurality of subcarriers.

18. The system of claim 17, wherein a bandwidth of the first segment is equal to a bandwidth of the second segment.

19. The system of claim 17, wherein a bandwidth of the first segment is different than a bandwidth of the second segment.

20. The system of claim 17, wherein a bandwidth associated with the first set of symbols is selected from a group consisting of 1.122 MHz, 2.256 MHz, and 4.5 MHz.

21. The system of claim 17, wherein to generate a symbol of the first set of symbols, the processor is configured to:
generate a constant amplitude zero auto-correlation sequence based on a root index value;
generate a Pseudo-Noise sequence based on a seed value;
modulate the constant amplitude zero auto-correlation sequence by the Pseudo-Noise sequence to generate a complex sequence; and
translate the complex sequence to a time domain sequence.

22. The system of claim 21, wherein the constant amplitude zero auto-correlation sequence has a length of 751 or 373 samples.

23. The system of claim 21, wherein the processor is configured to translate the complex sequence to the time domain sequence using an Inverse Fast Fourier Transform (IFFT).

24. The system of claim 17, wherein the second set of symbols comprises one or more preamble pilot signals, edge pilot signals, scattered pilot signals, and continual pilot signals.

25. The system of claim 17, wherein the processor is further configured to:
generate a fifth set of symbols and a sixth set of symbols, each symbol in the fifth set of symbols comprising a fifth plurality of subcarriers and each symbol in the sixth set of symbols comprising a sixth plurality of subcarriers,
wherein the fifth set of symbols comprises information about the sixth set of symbols,
wherein the fifth plurality of subcarriers are a subset of the sixth plurality of subcarriers,
wherein the data frame further comprises the fifth and sixth sets of symbols, and
wherein the bandwidth of the data frame comprises a third segment including the sixth plurality of subcarriers.

26. The system of claim 17, further comprising:
a second narrow band receiver configured to receive and decode the second set of symbols of the data frame.

27. The system of claim 17, wherein the processor is further configured to:
generate a second data frame; and
time multiplex the data frame and the second data frame.

28. The system of claim 27, further comprising:
a second narrow band receiver configured to receive and decode the second set of symbols of the data frame;
the first narrow band receiver configured to receive and decode the fourth set of symbols of the data frame; and
a third receiver configured to receive and decode the second data frame.

29. A transmitter, comprising:
a memory configured to store program instructions; and
a processor, upon executing the program instructions, configured to:
generate a data frame; and
cause transmission of the data frame,
wherein the data frame comprises a first set of orthogonal frequency domain multiplexing (OFDM) symbols and a second set of OFDM symbols, each OFDM symbol in the first set of OFDM symbols and the second set of OFDM symbols comprising a plurality of subcarriers,
wherein each OFDM symbol in the data frame is partitioned into a plurality of segments and each segment of the plurality of segments comprises a subset of the plurality of subcarriers,
wherein a first segment in the first set of OFDM symbols comprises information about a corresponding first segment in the second set of OFDM symbols that facilitates initial synchronization at a receiver, and
wherein the first segment of the second set of OFDM symbols is configured to be decoded, based at least in part on the information contained in the first segment of the first set of OFDM symbols, independently of other segments of the second set of OFDM symbols.

30. The transmitter of claim 29, wherein to generate the first segment of the first set of symbols, the processor is configured to:
generate a constant amplitude zero auto-correlation sequence based on a root index value, wherein the constant amplitude zero auto-correlation sequence has a length of 751 or 373 samples;
generate a Pseudo-Noise sequence based on a seed value;
modulate the constant amplitude zero auto-correlation sequence by the Pseudo-Noise sequence to generate a complex sequence; and
translate the complex sequence to a time domain sequence using an Inverse Fast Fourier Transform (IFFT).

* * * * *